(12) United States Patent
Oluseyi

(10) Patent No.: US 6,943,053 B2
(45) Date of Patent: Sep. 13, 2005

(54) SYSTEM, METHOD AND MEDIUM FOR MODELING, MONITORING AND/OR CONTROLLING PLASMA BASED SEMICONDUCTOR MANUFACTURING PROCESSES

(75) Inventor: Hakeem M. Oluseyi, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 241 days.

(21) Appl. No.: 10/101,215

(22) Filed: Mar. 20, 2002

(65) Prior Publication Data

US 2003/0190761 A1 Oct. 9, 2003

(51) Int. Cl.[7] .............................................. H01L 21/00
(52) U.S. Cl. .............................................. 438/70
(58) Field of Search .................. 438/712, 708, 438/704, 667, 626, 509, 411, 157, 107, 70, 22, 9, 7; 435/6; 700/121; 216/60, 59

(56) References Cited

U.S. PATENT DOCUMENTS 5,270,222 A * 12/1993 Moslehi .......................... 438/7
6,413,867 B1   7/2002 Sarfaty et al.
6,521,080 B2   2/2003 Balasubramhanya et al.
6,589,869 B2   7/2003 Sarfaty et al.

* cited by examiner

Primary Examiner—Carl Whitehead, Jr.
Assistant Examiner—Monica D. Harriston
(74) Attorney, Agent, or Firm—Wilmer, Cutler, Pickering Hale & Dorr

(57) ABSTRACT

A method, system, and medium of spectroscopically modeling and/or controlling a semiconductor manufacturing process. The modeling/controlling includes the steps of conducting a plurality of semiconductor manufacturing process runs by changing at least one of process parameters from its target value, and collecting spectral data indicative of the light emitted by plasma during each of said semiconductor manufacturing process runs. The modeling/controlling also includes the step of formulating a ratio based on a relationship between the collected spectral data and the changes in the at least one of the plurality of process parameters.

19 Claims, 19 Drawing Sheets

SYSTEM, METHOD AND MEDIUM FOR MODELING, MONITORING AND/OR CONTROLLING PLASMA BASED SEMICONDUCTOR MANUFACTURING PROCESSES

FIELD OF THE INVENTION

The present invention relates to enhancing process control of plasma based semiconductor manufacturing processes. In particular, at least some embodiments of the present invention relate to modeling and monitoring light spectra emitted by the plasma of a plasma based semiconductor manufacturing process and control the plasma based process based on the light spectra.

BACKGROUND OF THE INVENTION

A "plasma based semiconductor process" generally refers to a methodology for fabricating microelectronic devices such as very large scale integration (VLSI) microelectronic chips and/or thin film transistors (TFTs). In particular, plasma based semiconductor processes may be used, for example, in deposition processes (e.g., plasma enhanced chemical vapor deposition, hereinafter "PECVD") and/or etching processes during the fabrication of microelectronic devices.

For example, a PECVD run (a particular instance of conducting a PECVD process) includes the following steps: 1) a device to be processed is placed within a chamber; 2) an initial condition is created inside the chamber using control parameters (e.g., RF power, electrode spacing, gas pressure, $SiH_4$ flow, $N_2O$ flow, etc.); 3) plasma is ignited; 4) the control parameters are adjusted; 5) a desired end point (e.g., a predetermined thickness of a film being deposited) is reached; and 6) the run is then terminated.

During a PECVD run, diagnosis and proper process control of the PECVD run are desired in order to ensure that microelectronic devices produced by the PECVD run are free of defects. The diagnostics and proper process control may be provided manually or automatically in order to determine when an end point has been reached in order to adjust the control parameters while the PECVD run is in progress.

A first group of conventional methods for controlling a PECVD run focus on determining when its end point is reached. There are three general techniques in this group of conventional methods: (1) optical end point; (2) interferometric end point; and (3) test wafer measurement.

The optical end point technique involves determining the end point of a PECVD run by monitoring one or two narrow spectral bands of spectral emission from the plasma of the PECVD run. This technique is generally not predictive. In particular, use of this technique does not adequately permit detection of an approaching end point. Thus, a PECVD run must first come to its end point before the end point is observed by this technique, which almost always causes delays in terminating the PECVD run (which, e.g., can then result in the endpoint being overshot). While these shortcomings may be overlooked in experimental PECVD runs, they may cause unacceptable level of errors should this technique be used in manufacturing processes.

The interferometric end point technique also attempts to determine the end point, but uses interferometric interference fringes as a measurement. However, a number of different types of material (e.g., metal) do not show the interferometric interference fringes unless the film deposited by the PECVD run is extremely thin. Hence, this technique may not be viable for depositing metal films. In addition, similar to the optical end point technique described above, the interferometric technique does not predict the end points, thereby causing delays in stopping a PECVD run when its end point is reached.

The test wafer measurement technique involves determination of the quality of microelectronic devices by physically examining one or more microelectronic devices per a batch of manufactured microelectronic devices. Each time a test microelectronic device is examined and passes a minimum standard (e.g., is determined to be within a predetermined range of the end point thickness), it acts as a certification that microelectronic devices of the batch may also meet the minimum standard. However, when a test microelectronic device fails to meet the minimum standard, each and every one of the microelectronic devices of that batch must be discarded or individually tested, which is an expensive process because each microelectronic device may be worth many tens of thousands of dollars. Another drawback of this technique is the fact that many of the quality tests are destructive in nature.

In addition to the deficiencies mentioned above, the above described conventional techniques of process control cannot detect a PECVD run that has gone out of optimal process specifications (e.g., overshot the optimal thickness of the deposition film) while the process is ongoing. In addition, these techniques do not provide steps that are necessary to correct erroneous processes.

In order to reduce some of the shortcomings of the above-described techniques, a second group of conventional techniques have also been developed. This group of conventional techniques does not focus on determining when the end points have been reached as in the first conventional techniques. Instead, the second group monitors ongoing processes. An example of such techniques involves monitoring the control parameters. This technique has shown some success in predicting film properties for PECVD runs, but it is still relatively inaccurate in determining the end points because this technique relies only on the control parameters without monitoring the actual PECVD run (e.g., without monitoring the progress of the device being produced).

Thus, what is needed is a scheme to better control semiconductor processes so that, e.g., the quality of fabricated microelectronic devices will increase.

SUMMARY OF THE INVENTION

Embodiments of the present invention advantageously overcome the above described shortcomings of the aforementioned techniques. In particular, embodiments of the present invention provide a system, method and medium for modeling, monitoring, and/or controlling plasma based semiconductor manufacturing processes. For instance, in at least some embodiments of the present invention, a method of modeling/controlling a plasma based semiconductor manufacturing process includes the steps of conducting a plurality of semiconductor manufacturing process runs by changing at least one of process parameters from its target value, and collecting spectral data indicative of the light emitted by plasma during each of said semiconductor manufacturing process runs. The modeling/controlling also includes the step of formulating a ratio based on a relationship between the collected spectral data and the changes in the at least one of the plurality of process parameters.

BRIEF DESCRIPTION OF THE DRAWINGS

The detailed description of the present application showing various distinctive features may be best understood when the detailed description is read in reference to the appended drawing in which.

DETAILED DESCRIPTION

Figure 1:
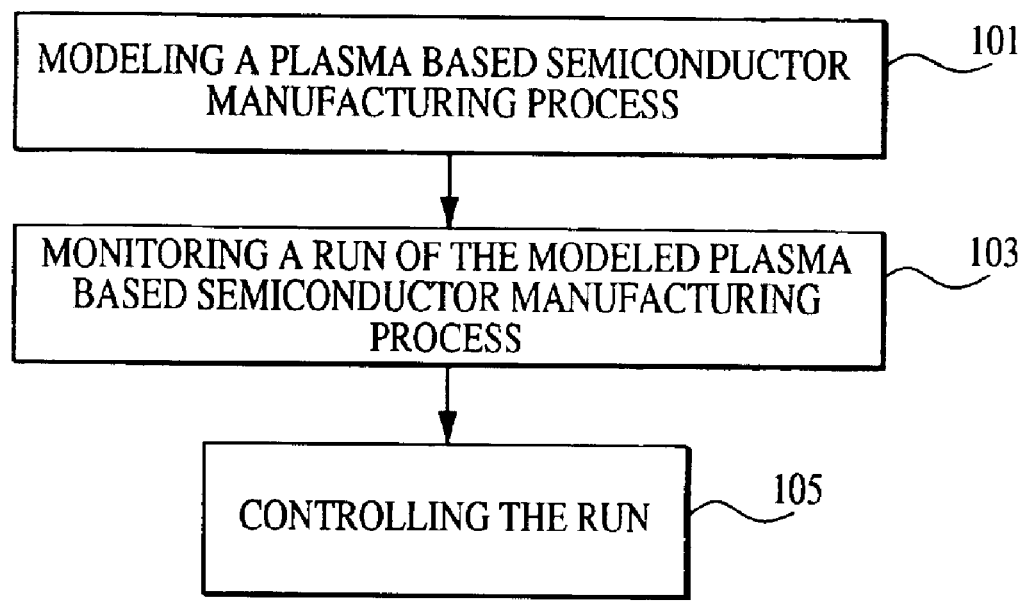
FIG. 1 is a high-level flow chart representation of example primary steps as contemplated by at least some embodiments of the present invention.

Embodiments of the present invention provide proper diagnostics and/or process control to plasma based semiconductor manufacturing processes by conducting one or more of the high-level steps indicated in FIG. 1. Referring now to FIG. 1, these steps include modeling, monitoring, and controlling the plasma based semiconductor manufacturing processes (steps 101, 103, and 105, respectively). These steps can be conducted in a sequence, but (as depicted in FIG. 1) in at least some embodiments of the present invention, one or more of the steps can be conducted independently from each other (e.g., in parallel). Each of these steps is described below in detail in the context of PECVD runs. However, it should be understood that at least some embodiments of the present invention also contemplate applying the same or similar steps in other plasma based semiconductor manufacturing processes (e.g., etching).

In the modeling step (step 101), characteristics of PECVD runs of a particular recipe are determined. A recipe is a set of control settings for control parameters such as specified ranges and application length of time. Examples of control parameters include RF power, electrode spacing, gas pressure, $SiH_4$ flow, and $N_2O$ flow. Thus, for instance, a recipe may specify how much RF power to apply and for how long during a PECVD run. A run is one specific instance of processing a wafer using a specified recipe.

Figure 2:
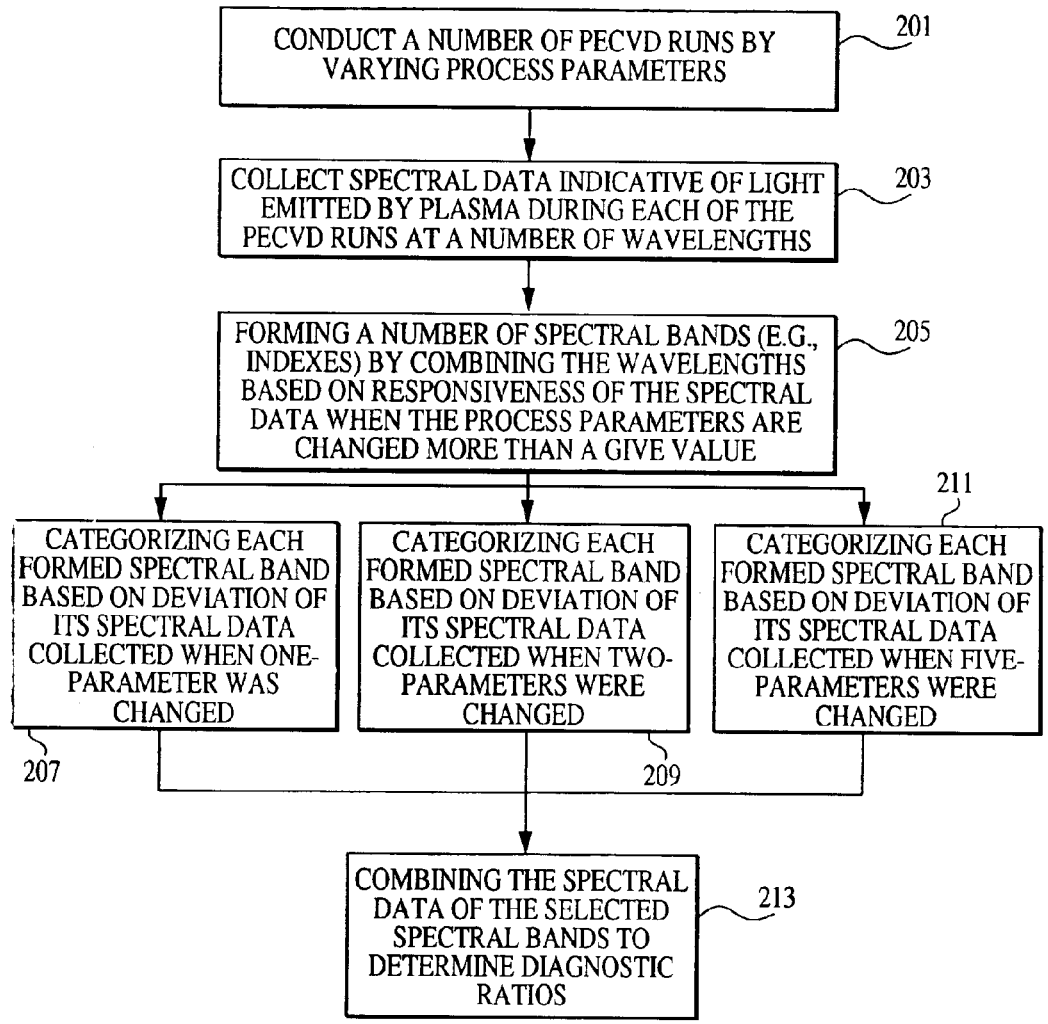
FIG. 2 is a flow chart representation of example steps in modeling a PECVD recipe.

Detail processes of the modeling step, which includes a number of sub-steps, are described with regard to FIG. 2. Referring now to FIG. 2, a number of PECVD runs are conducted by varying control parameters (step 201). While the PECVD runs are being conducted, spectral data is collected. The collected spectral data is indicative of (e.g., is proportional to) the light emitted by plasma during each of the PECVD runs (step 203). After the spectral data is collected and analyzed, a number of spectral bands are formed (step 205). Subsequently, the collected spectral data is categorized for each formed spectral band (steps 207, 209, 211), which forms the basis to determine diagnostic ratios (step 213). Each of these steps is described in greater detail below.

In context of modeling step 101, the step of conducting a number of PECVD runs (step 201) can be thought of as executing a modeling run. A modeling run may include a series of PECVD runs where the control settings of one or more control parameters are varied from a center point PECVD recipe. A center point recipe (also referred to as a target process) is a set of optimally designed control settings (also referred to as target values) for each of the control parameters to achieve a specific goal. For instance, a center point recipe designed to etch a layer may specify one set of optimal control settings. It should be noted that at least some embodiments of the present invention are directed to recipes other than PECVD. In such embodiments, their center point recipe may be designed to deposit a layer (e.g., a film) by using a corresponding set of optimal control settings. A non-center point recipe is a recipe that includes different control settings for one or more control parameters from those of the center point recipe.

An example modeling run for an optimal $SiO_2$ deposition recipe may include a number of different PECVD runs as follows: a center point run in which all control parameters are set to their optimal values and a number of non-center point runs in which the setting of one control parameter at a time is varied by plus/minus a predetermined percentage (e.g., 5% or 10%) over its optimal value. The variation on the settings of the control parameters can be any value as long as the variation is sufficient to cause an observable change in the collected spectral data. The number of the non-center point runs can be equal to, e.g., two times the number of control parameters when the settings of control parameters are changed one at a time.

Figure 3:
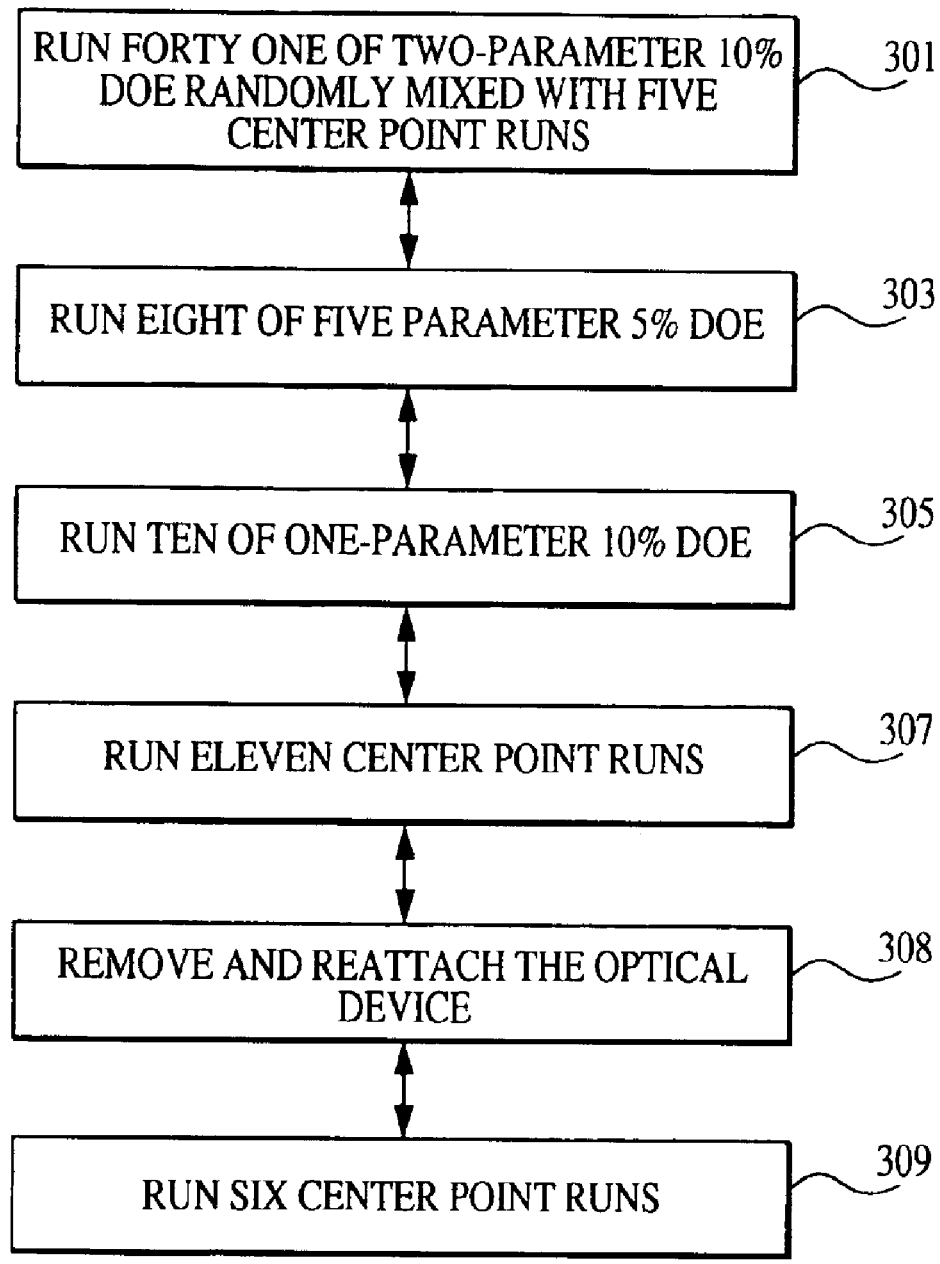
FIG. 3 is a flow chart representation of an example modeling run of the present invention.

Another example modeling run is described with regard to FIG. 3). Referring now to FIG. 3, this example modeling run contemplates the following: forty-six PECVD runs that consist of forty-one 2-parameter 10% PECVD runs (i.e., the settings of control parameters are changed two at a time, and are varied ±10% from the value of the center point run) with five center point runs dispersed randomly throughout (step 301); eight 5-parameter 5% PECVD runs (i.e., the settings of five control parameters are changed) (step 303); ten 1-parameter 10% PECVD runs (step 305); and eleven center point runs (step 307). Six more center point runs (step 309) also may be conducted after cleaning the system within which the runs are conducted (step 308). It should be noted that the above-discussed modeling run is merely an example contemplated by at least some embodiments of the present invention, and that any other number of PECVD runs and/or combination of variations to the settings of the control parameters of the center point recipe are also envisioned by the present invention.

Table 1 illustrates detailed information on a modeling run similar to the above example modeling run of FIG. 3. In Table 1, a sequence of symbols such as "++ . . . " in the "Pattern" column designates that the first two parameters (i.e., pressure and electrode spacing) are increased while the last three parameters (i.e., power, $SiH_4$ and $N_2O$) are decreased. Similarly the sequence of symbols "00-00" designates that the third parameter is decreased while the rest of parameters are not changed. Since each run processes a wafer, the runs are referenced using wafer numbers in Table 1.

TABLE 1

Center Point (CP) values below.

| | Pressure | Spacing | Power | SiH4 | N2O |
|---|---|---|---|---|---|

1. Perform chamber conditioning. Obtain CP values.

| | | | | | |
|---|---|---|---|---|---|
| CP | 2.70 | 500 | 315.0 | 260 | 3500 |

Calculated 10% and 5% values (enter any other value below if calculated value is not desired):

| | | | | | |
|---|---|---|---|---|---|
| +10% | 2.97 | 550 | 347.0 | 286 | 3850 |
| −10% | 2.43 | 450 | 283.0 | 234 | 3150 |
| +5% | 2.84 | 525 | 331.0 | 273 | 3675 |
| −5% | 2.57 | 475 | 299.0 | 247 | 3325 |

| Wafer | Pattern | Pressure | Spacing | Power | SiH4 | N2O |
|---|---|---|---|---|---|---|

2. Run 46 wafers according to the following 10% recipe.

| 1 | 00000 | 2.70 | 500 | 315.0 | 260 | 3500 |
|---|---|---|---|---|---|---|
| 2 | 000++ | 2.70 | 500 | 315.0 | 286 | 3850 |
| 3 | 0+−00 | 2.70 | 550 | 283.0 | 260 | 3500 |
| 4 | 00000 | 2.70 | 500 | 315.0 | 260 | 3500 |
| 5 | 00000 | 2.70 | 500 | 315.0 | 260 | 3500 |
| 6 | −+000 | 2.43 | 550 | 315.0 | 260 | 3500 |
| 7 | 0−00− | 2.70 | 450 | 315.0 | 260 | 3150 |
| 8 | −0+00 | 2.43 | 500 | 347.0 | 260 | 3500 |
| 9 | 0−+00 | 2.70 | 450 | 347.0 | 260 | 3500 |
| 10 | +000− | 2.97 | 500 | 315.0 | 260 | 3150 |
| 11 | 0+00+ | 2.70 | 550 | 315.0 | 260 | 3850 |
| 12 | 0−−00 | 2.70 | 450 | 283.0 | 260 | 3500 |
| 13 | 00000 | 2.70 | 500 | 315.0 | 260 | 3500 |
| 14 | 00−0+ | 2.70 | 500 | 283.0 | 260 | 3850 |
| 15 | −0−00 | 2.43 | 500 | 283.0 | 260 | 3500 |
| 16 | +0+00 | 2.97 | 500 | 347.0 | 260 | 3500 |
| 17 | 000−+ | 2.70 | 500 | 315.0 | 234 | 3850 |
| 18 | 0−00+ | 2.70 | 450 | 315.0 | 260 | 3850 |
| 19 | 0+0−0 | 2.70 | 550 | 315.0 | 234 | 3500 |
| 20 | 0+0+0 | 2.70 | 550 | 315.0 | 286 | 3500 |
| 21 | +00−0 | 2.97 | 500 | 315.0 | 234 | 3500 |
| 22 | 00000 | 2.70 | 500 | 315.0 | 260 | 3500 |
| 23 | +−000 | 2.97 | 450 | 315.0 | 260 | 3500 |
| 24 | 0−0+0 | 2.70 | 450 | 315.0 | 286 | 3500 |
| 25 | 00−0− | 2.70 | 500 | 283.0 | 260 | 3150 |
| 26 | 000+− | 2.70 | 500 | 315.0 | 286 | 3150 |
| 27 | +000+ | 2.97 | 500 | 315.0 | 260 | 3850 |
| 28 | 00−+0 | 2.70 | 500 | 283.0 | 286 | 3500 |
| 29 | −00−0 | 2.43 | 500 | 315.0 | 234 | 3500 |
| 30 | −−000 | 2.43 | 450 | 315.0 | 260 | 3500 |
| 31 | ++000 | 2.97 | 550 | 315.0 | 260 | 3500 |
| 32 | 00++0 | 2.70 | 500 | 347.0 | 286 | 3500 |
| 33 | +00+0 | 2.97 | 500 | 315.0 | 286 | 3500 |
| 34 | +0−00 | 2.97 | 500 | 283.0 | 260 | 3500 |
| 35 | 000−− | 2.70 | 500 | 315.0 | 234 | 3150 |
| 36 | 00+0− | 2.70 | 500 | 347.0 | 260 | 3150 |
| 37 | 00+0+ | 2.70 | 500 | 347.0 | 260 | 3850 |
| 38 | −000− | 2.43 | 500 | 315.0 | 260 | 3150 |
| 39 | 0+00− | 2.70 | 550 | 315.0 | 260 | 3150 |
| 40 | 00+−0 | 2.70 | 500 | 347.0 | 234 | 3500 |
| 41 | −000+ | 2.43 | 500 | 315.0 | 260 | 3850 |
| 42 | −00+0 | 2.43 | 500 | 315.0 | 286 | 3500 |
| 43 | 00−−0 | 2.70 | 500 | 283.0 | 234 | 3500 |
| 44 | 0++00 | 2.70 | 550 | 347.0 | 260 | 3500 |
| 45 | 00000 | 2.70 | 500 | 315.0 | 260 | 3500 |
| 46 | 0−0−0 | 2.70 | 450 | 315.0 | 234 | 3500 |

3. Run 8 wafers according to the following 5% recipe.

| 47 | +−+−− | 2.84 | 475 | 331.0 | 247 | 3325 |
|---|---|---|---|---|---|---|
| 48 | −−++− | 2.57 | 475 | 331.0 | 273 | 3325 |
| 49 | −++−+ | 2.57 | 525 | 331.0 | 247 | 3675 |
| 50 | +−−++ | 2.84 | 475 | 299.0 | 273 | 3675 |
| 51 | −−−−+ | 2.57 | 475 | 299.0 | 247 | 3675 |
| 52 | +++++ | 2.84 | 525 | 331.0 | 273 | 3675 |
| 53 | −+−+− | 2.57 | 525 | 299.0 | 273 | 3325 |
| 54 | ++−−− | 2.84 | 525 | 299.0 | 247 | 3325 |

4. Run 10 wafers varying one parameter at a time as follows.

| 55 | +0000 | 2.97 | 500 | 315.0 | 260 | 3500 |
|---|---|---|---|---|---|---|
| 56 | −0000 | 2.43 | 500 | 315.0 | 260 | 3500 |
| 57 | 0+000 | 2.70 | 550 | 315.0 | 260 | 3500 |
| 58 | 0−000 | 2.70 | 450 | 315.0 | 260 | 3500 |
| 59 | 00+00 | 2.70 | 500 | 347.0 | 260 | 3500 |
| 60 | 00−00 | 2.70 | 500 | 283.0 | 260 | 3500 |
| 61 | 000+0 | 2.70 | 500 | 315.0 | 286 | 3500 |
| 62 | 000−0 | 2.70 | 500 | 315.0 | 234 | 3500 |
| 63 | 0000+ | 2.70 | 500 | 315.0 | 260 | 3850 |
| 64 | 0000− | 2.70 | 500 | 315.0 | 260 | 3150 |

Run 10 wafers at CP.

| 65 to 74 | 00000 | 2.70 | 500 | 315.0 | 260 | 3500 |
|---|---|---|---|---|---|---|

Figure 4:
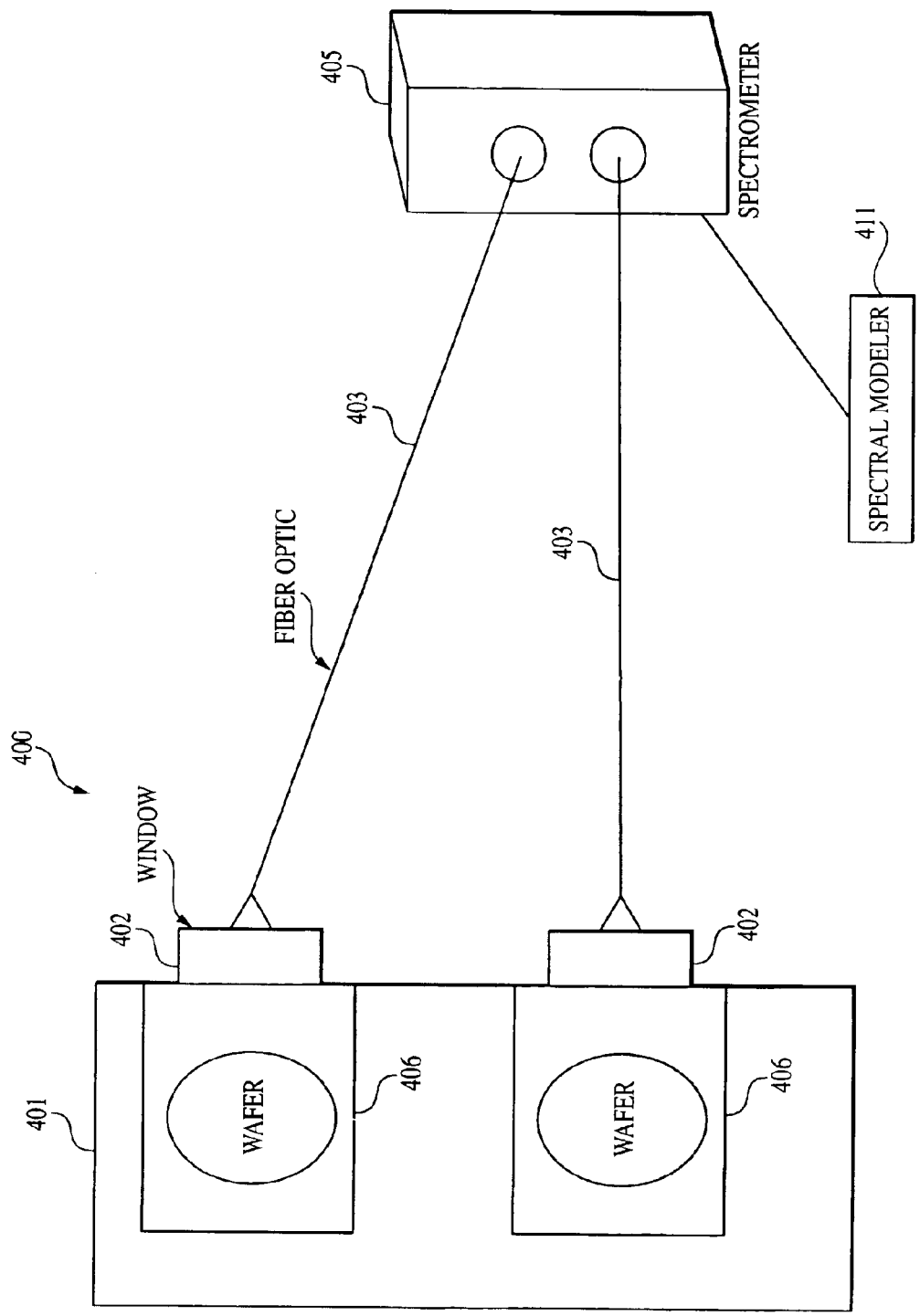
FIG. 4 is a top view of an example setup for the modeling run of the present invention.

The above described modeling run and the step of collecting spectral data (step 203) can be carried out in a spectral data collection system, such as the one illustrated in FIG. 4. Referring first to FIG. 4, system 400 includes wafer tool 401 within which the PECVD runs take place and a spectrometer 405 configured to collect spectral data indicative of the light emitted by the plasma during the PECVD runs, via one or more optical fibers 403. System 400 may also include a spectral modeler 411 configured to store and analyze the spectral data collected by spectrometer 405.

As shown in FIG. 4, a pair of chambers 406 may be provided. Each chamber includes a window 402 through which light emitted by respective plasma of a PECVD run may be observed. Window 402 is preferably made of quartz, which is highly transmissive through a wide range of photon wavelengths (e.g., 200 nm<λ<850 nm). One end of optical fiber 403 is attached to one of windows 402 to collect light emitted by plasma. The other end of optical fiber 403 is attached to spectrometer 405. In at least some embodiments of the present invention, wafer tool 401 is an Applied Materials 200 mm Producer system.

In at least some embodiments of the present invention, spectrometer 405 can be any commercially available spectrometer. An example is a spectrometer manufactured by OceanOptics, Inc., of Dunedin, Fla., which focuses the light on a blazed reflection grating (e.g., OceanOptics grating #10) that includes 1800 lines/mm and a specific spectral response. The light emitted by the plasma is wavelength dispersed and focused onto a 2048 linear Charge Coupled Device (CCD) array. Note that the dispersion is wavelength dependent with a greater spectral resolution near 850 nm than near 200 nm. Another example is a portable Verity™ spectrometer system that includes the above described spectrometer integrated with control software. Spectrometer 405 is used to capture the light emitted during the PECVD runs and generate spectral data. It should be noted that any spectrometer is sufficient for the purpose of the present invention as long as it is configured to have similar characteristics as that described above.

Once the spectral data for the modeling run has been collected, a preliminary analysis of the spectral data can be conducted (and can be thought of as part of, e.g., step 203). The following steps describe spectral data analysis procedures that can be done manually and/or using software program(s).

Figure 5:
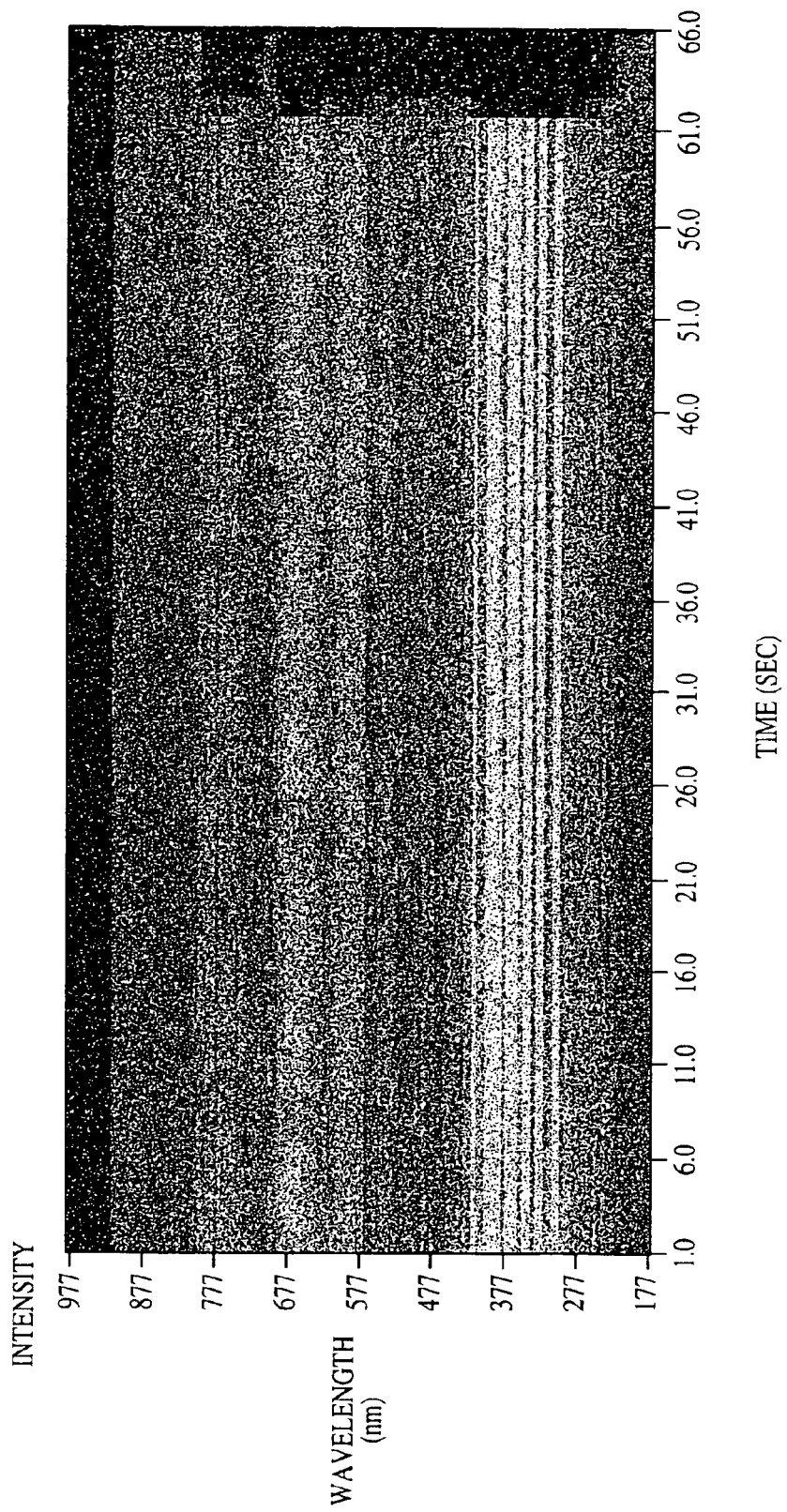
FIG. 5 is a graph representing a three-dimensional spectrum for an example PECVD run.

In one instance of the preliminary analysis, the collected spectral data may be displayed on a computer display monitor (or used as input for an analysis program) in a number of different ways to provide different perspective of the collected spectral data. Example display methods may include: graphically displaying three-dimensional spectral data (wavelength on the vertical axis vs. time on the horizontal axis vs. intensity displayed as gray level variation, FIG. 5); graphically displaying total time-dependent aspects of the spectral data (i.e., the sum of the spectral data in all 2048 CCD channels recorded each second, FIG. 6); graphically displaying spectral data captured by an individual CCD channel per second (FIG. 7); graphically displaying spectral data at a given time (i.e., the intensity in each of the 2048 CCD channels at a particular time, FIG. 8); and, graphically displaying time-averaged spectral data (i.e., the average spectral data recorded in each of the 2048 CCD channels for the 60 second processes).

The above-described spectral data can be collected using various techniques. One collection technique contemplated by at least some embodiments of the present invention is described below in connection with the collection of three-dimensional (intensity vs. wavelength vs. time) spectral data. Such data may be collected by spectrometer 405 during a modeling run using, e.g., an $SiO_2$ deposition recipe in the following manner. After a plasma is ignited in one or both of the chambers 406, spectrometer 405 starts to collect spectral data when the intensity of the plasma emission reaches a pre-set threshold value. In the example data collection procedure, while the PECVD runs are being conducted, the CCD of spectrometer 405 is exposed to the light emitted by the plasma for 163 ms at a time, and raw spectral data during the exposure is recorded. Each second, six of these raw spectral data are averaged to produce a spectral data entry. For a run that has, for example, a 60 second duration, sixty spectral data entries are recorded during each PECVD run with a temporal resolution of one spectral data entry per second. At the end of the 60-second process the plasma is switched off and ten seconds of dark spectral data can be recorded in the same manner. The dark spectral data can be used as a background subtraction value during the spectral analyses in which the background subtraction value is subtracted from the spectral data collected during the PECVD runs. It should be noted that the above-described data collection procedure is provided only as an example. Accordingly, specific data collection timing and mechanism are not critical to embodiments of the present invention.

As can be appreciated by the previous discussions, another part of the preliminary analysis as contemplated by at least some embodiments of the present invention includes analyzing the spectral data collected during the center point runs. This analysis establishes a baseline against which changes observed in the spectral data of the various non-center point recipes can be compared. This analysis may begin with characterization of the time-dependent behavior of the total emission (the sum of the intensities recorded in the 2048 CCD pixels each second, FIG. 8) and the time-dependent behavior of individual spectral bands (the intensity recorded in individual pixels each second) as exemplified in FIG. 9.

Figure 6:
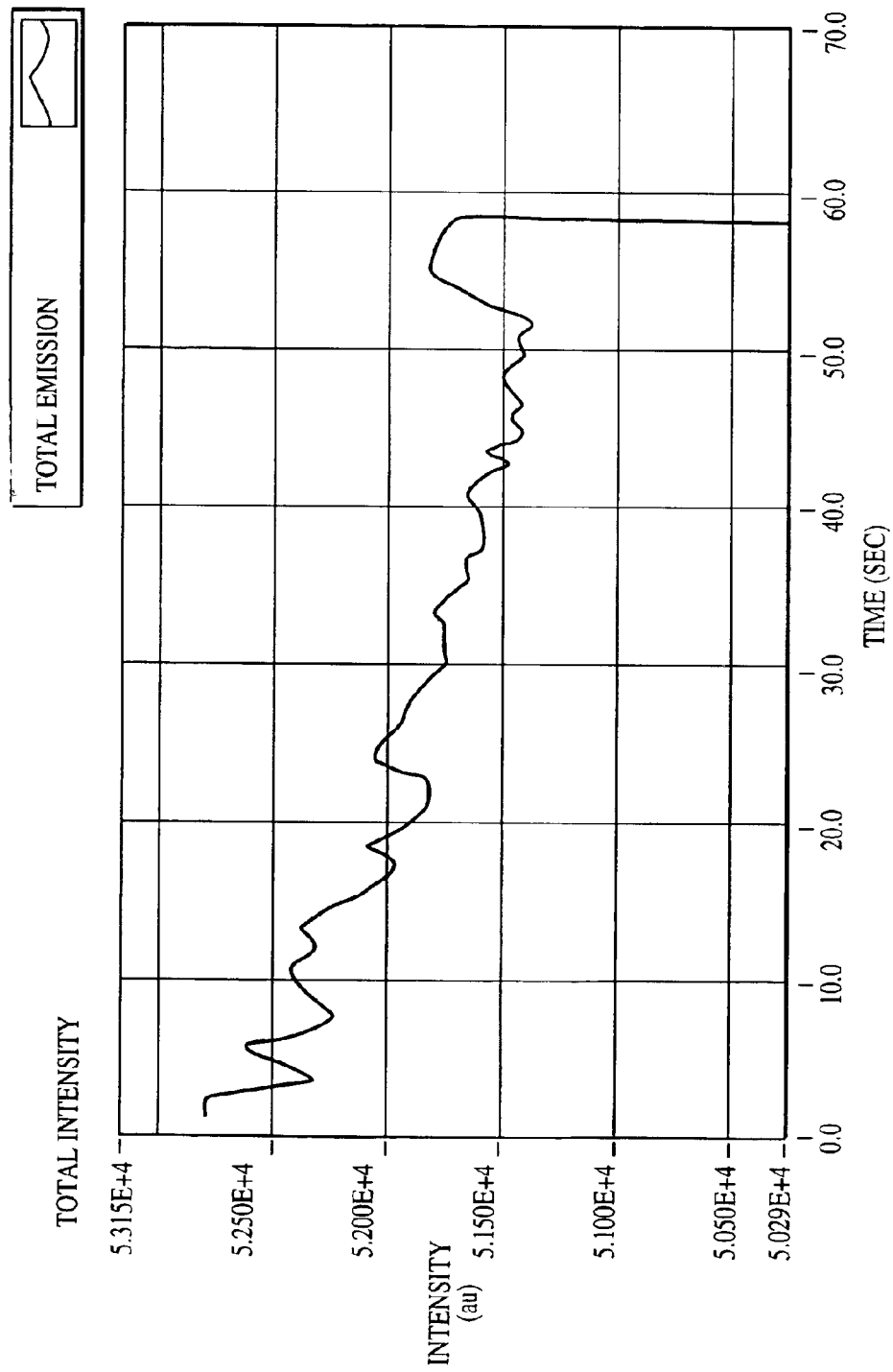
FIG. 6 is a graph representing a trace of total intensity of an example PECVD run.

The characterization of the time dependent behavior of the total emission may involve measuring the magnitude of the total emission observed as a function of time and noting any structure in the spectral data. FIG. 6 shows a typical total spectral data trace (the sum of the spectral data in all of the 2048 CCD channels plotted every second). It may also be observed (as was the case in an example herein) that the spectral data begins with a value of about $5.25 \times 10^4$ au and decays to a value of about $5.15 \times 10^4$ au near the end of the run (see FIG. 6). The main result from the characterization of the time dependent behavior of the total run is that, in general, the total observed emission shows a slight decrease (1 to 2%) over the course of the run.

Figure 7:
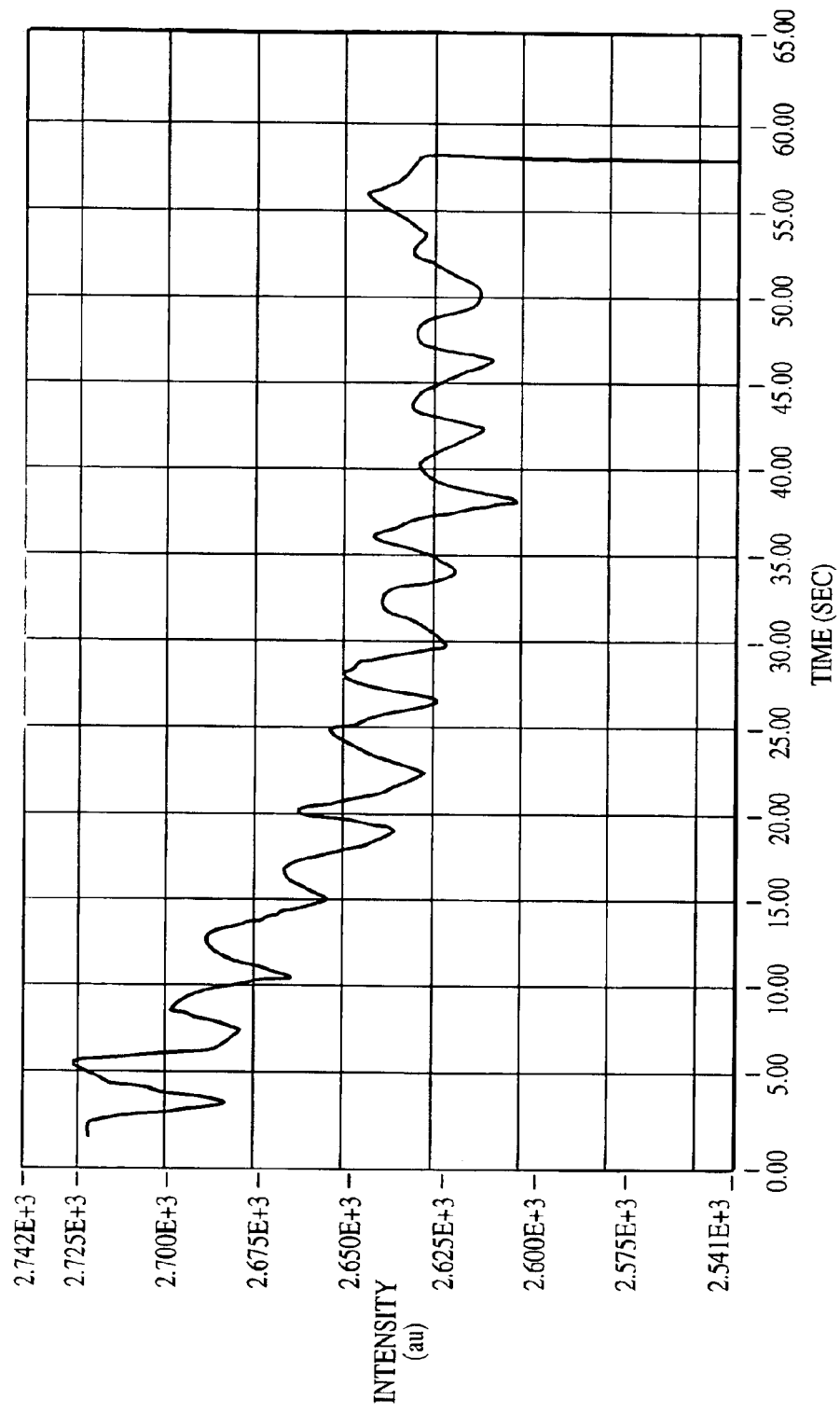
FIG. 7 is a graph representing a trace of intensity at a certain wavelength of an example PECVD run.
Figure 8:
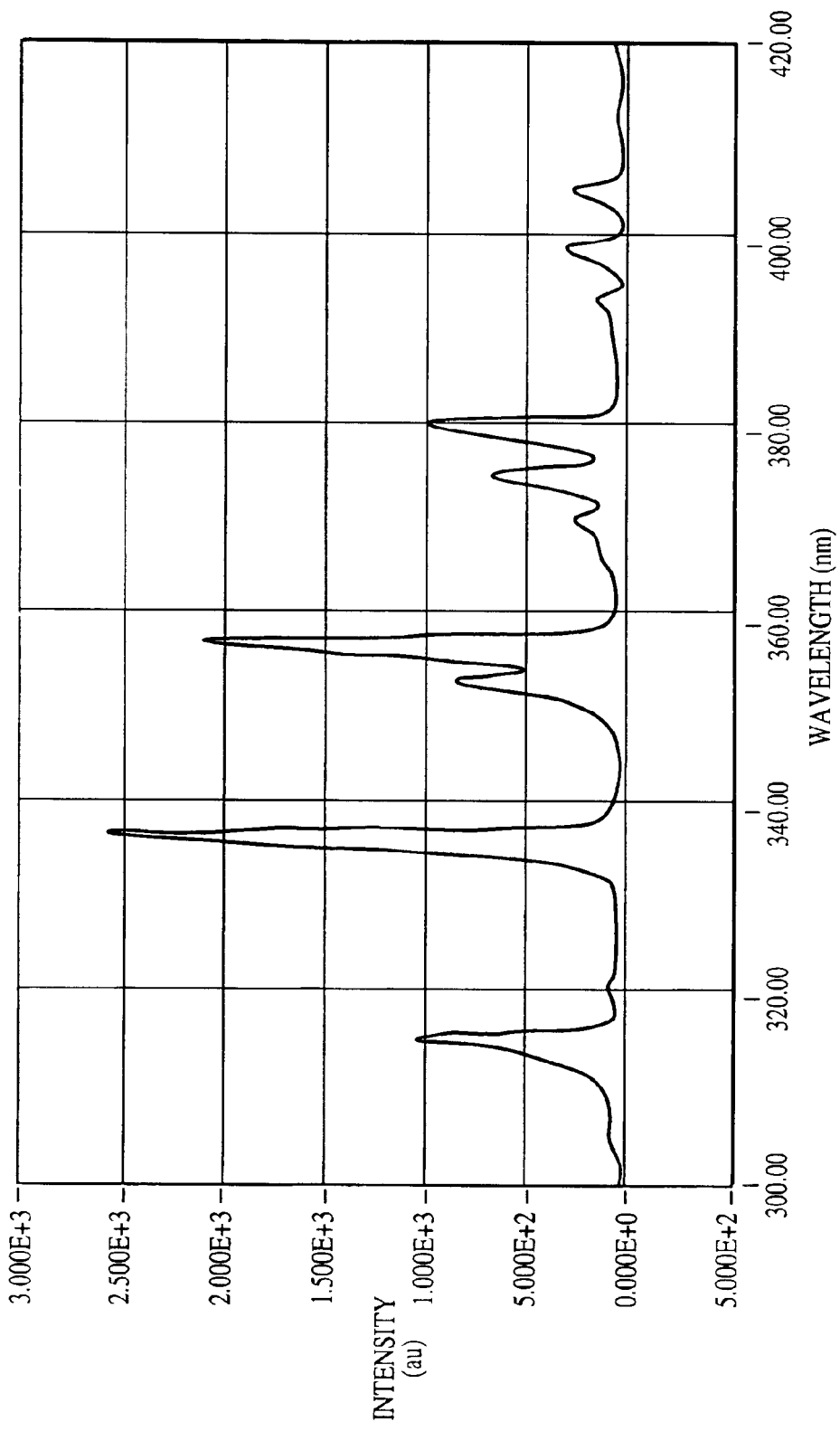
FIG. 8 is a graph representing intensity of a section of a spectrum at a give time of an example PECVD run.
Figure 9:
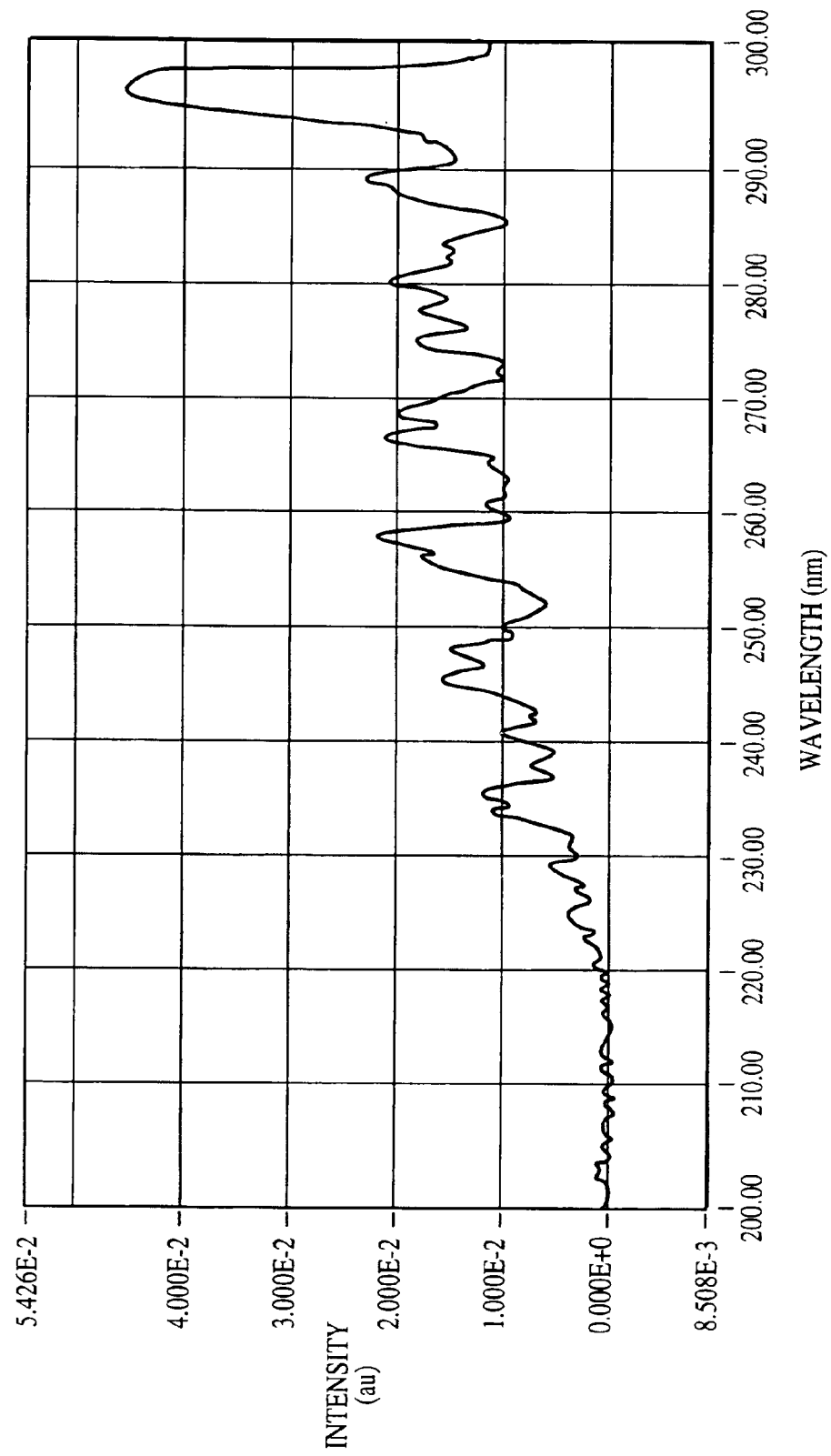
FIG. 9 is a graph representing a trace of the 200 nm–300 nm section of an example center point spectrum.
Figure 10:
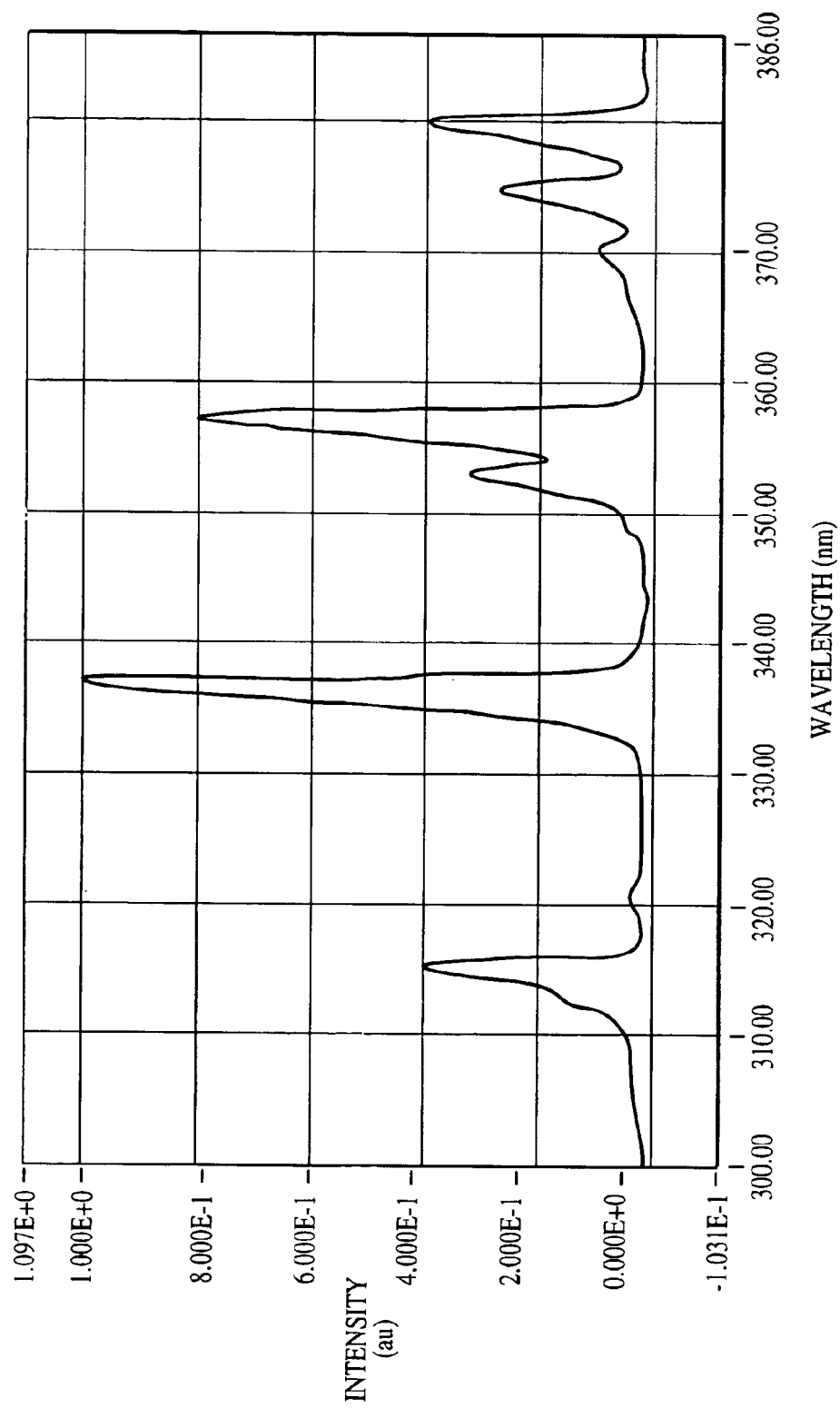
FIG. 10 is a graph representing a trace of the 300 nm–387 nm section of an example center point spectrum.
Figure 11:
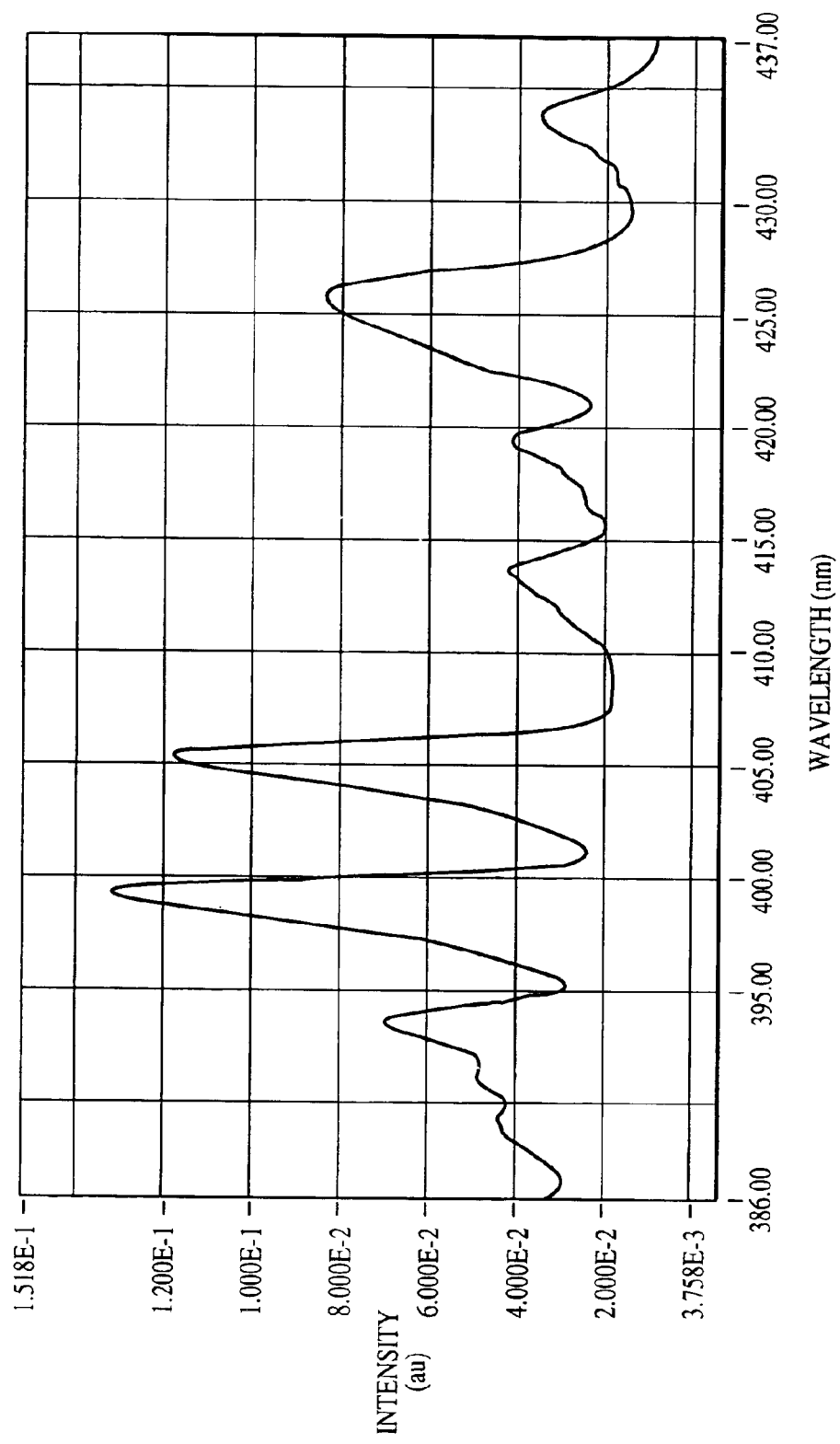
FIG. 11 is a graph representing a trace of the 387 nm–437 nm section of an example center point spectrum.
Figure 12:
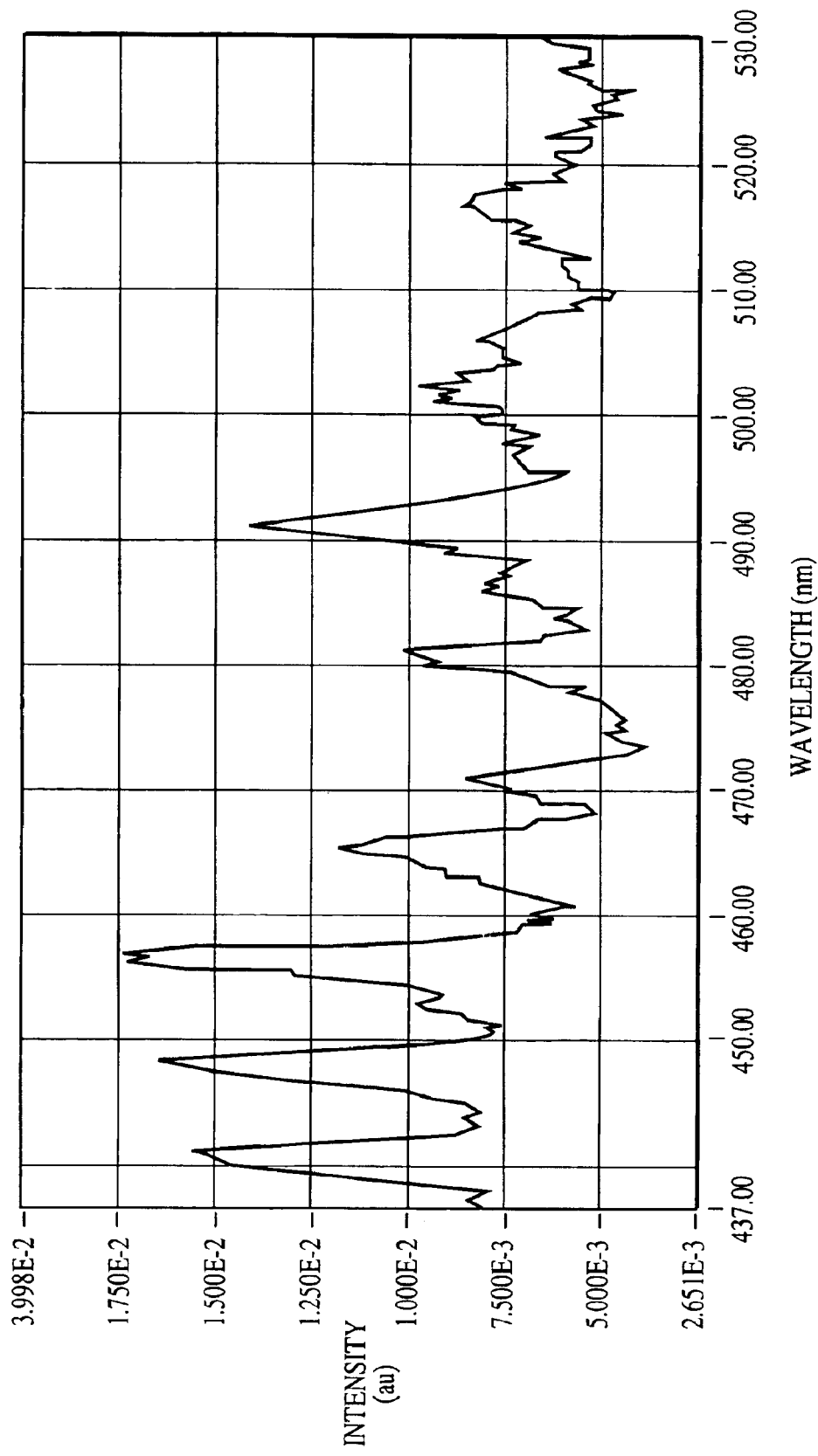
FIG. 12 is a graph representing a trace of the 437 nm–530 nm section of an example center point spectrum.
Figure 13:
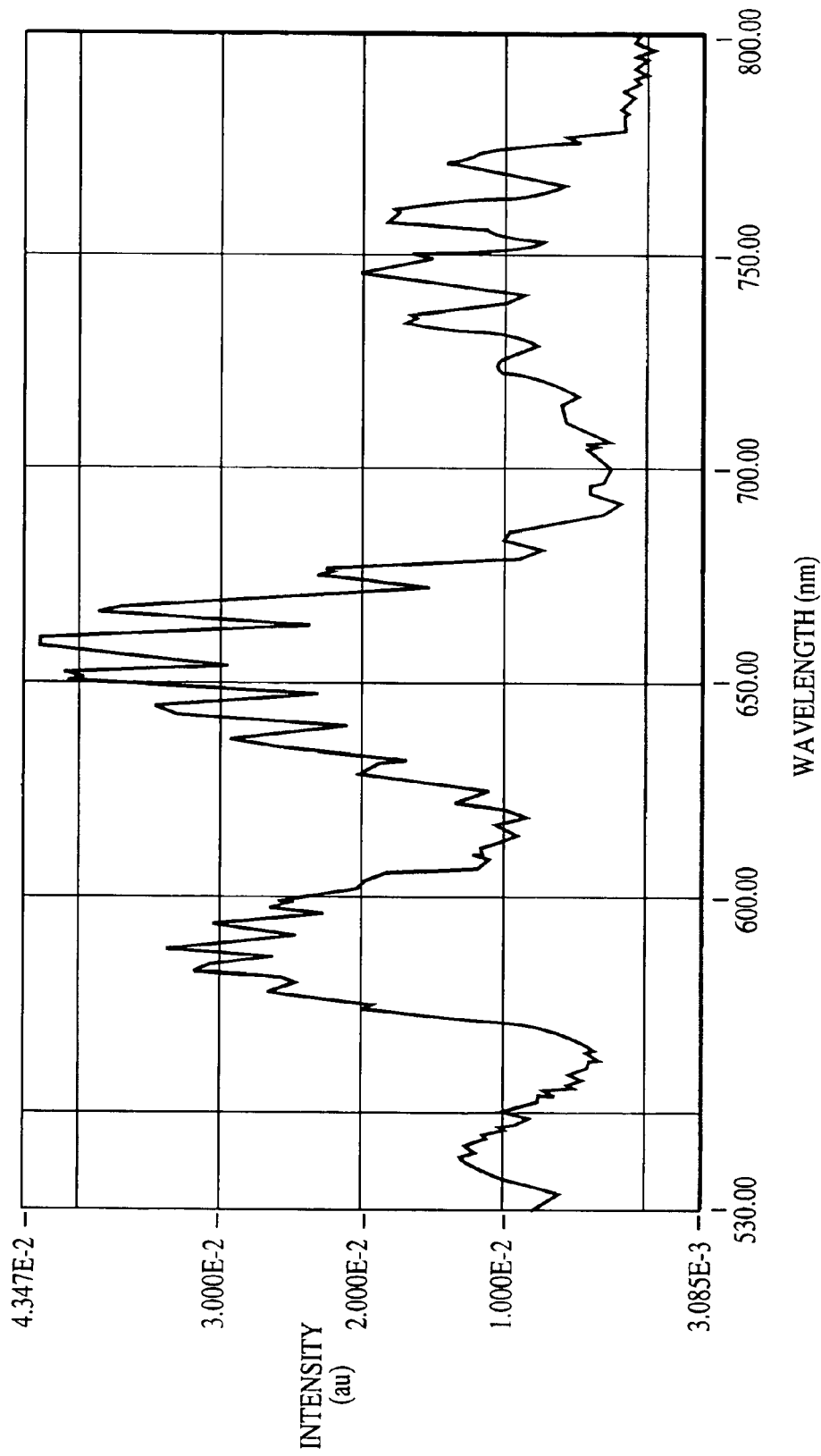
FIG. 13 is a graph representing a trace of the 530 nm–800 nm section of an example center point spectrum.

In addition, the characterization of the time-dependent behavior of the center point runs may involve the characterization of the time-dependent behavior of individual spectral bands. FIG. 7 shows typical spectral data for a range of wavelengths. The trace line shown in FIG. 8 is the dominant line in the spectral data that occurs at the wavelength of $\lambda \sim 336.66$ nm. Two different behaviors are observed in the spectral data.

The first behavior is the ±1% periodic oscillation of the spectral data. This behavior is consistent with interference fringes arising from the interaction of light reflecting from the substrate of the wafer undergoing the PECVD runs and the surface of the growing film during the PECVD run. As the film grows, the increasing thickness of the film causes the reflected light to add alternatively (e.g., constructively and destructively) as a function of time, giving rise to the fringe pattern. It follows that the light received by spectrometer 405 originates from two main sources: the light emitted by the plasma directly into spectrometer 405 and the light reflected from the surface of the wafer. (Note that it is also likely that reflection from the chamber walls and stray light from window 402 may also contribute to the collected spectral data). Because the light directly emitted from the plasma constitutes the main component of the collected light rather than that reflected from the wafer surface, the interference fringes correspond to only a ±1% component of the collected spectral data.

The second behavior noted in the wavelength traces is that the values of the spectral data decay for the first 30 seconds of the runs and then plateau for the final 30 seconds. This behavior may result because the light is reflected from two components. As noted above, the first component is the light that is reflected from the substrate and the second component is the light that is reflected from the surface of the growing film. If the substrate is more reflective than the film, the intensity of the reflected component of the light may decrease with time as the film grows. When the film becomes sufficiently thick, the values of the spectral data plateau because the component reflected from the substrate is minimized. A prediction of this model is that the interference fringes should disappear as the light reflected from the substrate is minimized. Therefore, it is expected that all traces decrease by about the same amount if the chamber and process conditions are equivalent for each run.

The above-described characterizations of the preliminary analysis are provided only as examples. Other observations and characterizations within the skill set of one of ordinary skill in the art are also contemplated within embodiments of the present invention.

After the preliminary analysis (or after collecting the spectral data without performing the preliminary analysis), a number of spectral bands are formed by combining the collected spectral data from a range of wavelengths (step 205). For example, FIGS. 9–13 show sections of collected spectral data of a typical center point run. The full spectrum covers the range from 250 nm<λ<800 nm. The spectral data shown are normalized to the value of the dominant line in the spectral data which, in this example, occurs at λ~336.66 nm. Example spectral bands are identified in the spectral data and are presented in Table 2. More specifically, each band is defined as those wavelengths existing between the "initial" and "final" wavelengths. It should be noted that the set of bands illustrated in Table 2 is provided only as an example. Different sets of bands can also be used as shown in, e.g., Table 3 below.

TABLE 2

| $\lambda_0$ [nm] | λ(initial) | λ(final) |
|---|---|---|
| N/A | 250 | 300 |
| 314 | 310 | 317 |
| 337 | 331 | 342 |
| 350 | 347 | 354 |
| 357 | 355 | 360 |
| 367 | 363 | 372 |
| 374 | 372 | 377 |
| 380 | 377 | 383 |
| 390 | 387 | 395 |
| 398 | 396 | 401 |
| 404 | 401 | 408 |
| 414 | 410 | 416 |
| 418 | 416 | 421 |
| 426 | 421 | 430 |
| 434 | 430 | 437 |
| 442 | 438 | 444 |
| 448 | 444 | 451 |
| 456 | 451 | 460 |
| 465 | 460 | 469 |
| 472 | 469 | 474 |
| 483 | 477 | 488 |
| 547 | 532 | 563 |
| 655 | 620 | 691 |
| 752 | 720 | 784 |

Once spectral bands are determined, spectral data corresponding to each formed spectral band is calculated, categorized, and analyzed (steps 207, 209 and 211). The categorization and analysis are conducted according to the number of control parameters changed from those of the center point recipe. In other words, the spectral data collected when the setting of one control parameter is changed is categorized and analyzed together (step 207). Similarly, the spectral data when the settings of two control parameters are changed is categorized and analyzed together (step 209) and so on. The following section describes the process of categorizing and analyzing the spectral data when the setting of one control parameter is changed, but similar analysis may be conducted for the spectral data collected when more than one parameter is changed. Spectral data collected during each example one-parameter 10% PECVD run is compared with the spectral data collected during the center point PECVD runs. By this comparison, the effect that each of the control parameters has on the optical emission spectra of process plasmas may then be determined. Table 3 shows the results of examining the spectral data to characterize the effects of five example control parameters on the individual spectral bands in the 1-parameter 10% PECVD runs. The 730–780 nm bands in each of the collected spectral data were normalized, since this band shows the least sensitivity to varying the settings on control parameters. Increases or decreases in the band intensities are then noted. Seven different symbols are used in the table:

⇑ significant increase in band intensity

↑ increase in band intensity

↗ minor increase in band intensity

⇔ no effect

↘ minor decrease in band intensity

↓ decrease in band intensity

⇓ significant decrease in band intensity

It should be noted that, although Table 3 shows only qualitative measurements, using precise quantitative numbers is also contemplated within at least some embodiments of the present invention.

TABLE 3

| Spectral Band (nm) | Pressure | | Spacing | | Power | | SiH$_4$ | | N$_2$O | |
|---|---|---|---|---|---|---|---|---|---|---|
| | Hi | Lo | Hi | Lo | Hi | Lo | Hi | Lo | Hi | Lo |
| 310–317 | ↓ | ↑ | ↗ | ⇔ | ⇔ | ⇔ | ⇔ | ⇔ | ↑ | ↓ |
| 332–338.5 | ↓ | ↑ | ↑ | ⇔ | ⇔ | ⇔ | ↗ | ↗ | ↑ | ↓ |
| 347.5–354.5 | ↘ | ↗ | ↑ | ⇔ | ⇔ | ⇔ | ⇔ | ⇔ | ↗ | ⇔ |
| 354.6–360 | ↓ | ↑ | ↑ | ⇔ | ⇔ | ⇔ | ⇔ | ⇔ | ↑ | ↓ |
| 362.5–372.5 | ⇔ | ⇔ | ↑ | ⇔ | ⇔ | ⇔ | ⇔ | ⇔ | ↗ | ⇔ |
| 372.5–376.8 | ↓ | ↑ | ↑ | ⇔ | ⇔ | ⇔ | ⇔ | ⇔ | ↑ | ↓ |

TABLE 3-continued

| Spectral Band (nm) | Pressure Hi | Pressure Lo | Spacing Hi | Spacing Lo | Power Hi | Power Lo | SiH$_4$ Hi | SiH$_4$ Lo | N$_2$O Hi | N$_2$O Lo |
|---|---|---|---|---|---|---|---|---|---|---|
| 376.8–382 | ↓ | ↑ | ↑ | ↔ | ↔ | ↔ | ↔ | ↔ | ↑ | ↓ |
| 386–392.5 | ↑ | ↓ | ↑ | ↘ | ↘ | ↗ | ↔ | ↔ | ↔ | ↔ |
| 392.5–395 | ↓ | ↑ | ↑ | ↔ | ↘ | ↗ | ↔ | ↔ | ↔ | ↔ |
| 395–401.5 | ↓ | ↑ | ↑ | ↘ | ↔ | ↔ | ↗ | ↗ | ↑ | ↓ |
| 401.5–408 | ↓ | ↑ | ↑ | ↔ | ↔ | ↔ | ↔ | ↔ | ↑ | ↓ |
| 410–416 | ↑ | ↓ | ↑ | ↔ | ↑ | ↓ | ↓ | ↑ | ↔ | ↔ |
| 416–421 | ↔ | ↔ | ↑ | ↑ | ↗ | ↘ | ↘ | ↑ | ↗ | ↘ |
| 421–430 | ↔ | ↔ | ↑ | ↔ | ↘ | ↗ | ↔ | ↔ | ↘ | ↗ |
| 430–437 | ↓ | ↑ | ↔ | ↔ | ↔ | ↗ | ↗ | ↗ | ↗ | ↘ |
| 438–444 | ↔ | ↔ | ↔ | ↔ | ↔ | ↔ | ↔ | ↔ | ↔ | ↗ |
| 444–451 | ↓ | ↗ | ↗ | ↔ | ↔ | ↔ | ↔ | ↔ | ↑ | ↔ |
| 451–460 | ↓ | ↗ | ↔ | ↔ | ↔ | ↔ | ↔ | ↔ | ↗ | ↓ |
| 460–469 | ↔ | ↔ | ↔ | ↔ | ↔ | ↔ | ↔ | ↔ | ↔ | ↔ |
| 469–474 | ↔ | ↔ | ↔ | ↔ | ↔ | ↔ | ↔ | ↔ | ↔ | ↔ |
| 477–488 | ↔ | ↔ | ↔ | ↔ | ↔ | ↔ | ↔ | ↔ | ↔ | ↔ |
| 488–496 | ↔ | ↑ | ↔ | ↔ | ↔ | ↔ | ↔ | ↔ | ↔ | ↔ |

In Table 3, it can be observed that three of the bands (395–401.5, 401.5–408, and 410–416) are all sensitive to pressure changes on and spacing of electrodes. In other words, when the pressure and spacing of electrodes change, corresponding spectral data in those bands also changes. In another example, for the electrode spacing, there are two bands (386–392.5 and 395–401.5) that are sensitive to distinguish two settings. More specifically, when the spacing is set to be large (the "Hi" setting), significant increase of intensities in those bands are observed; whereas, when the spacing is set to be small (the "Lo" setting) minor decreases of intensities in those bands are observed. Based on this analysis, when minor decreases of intensities in those bands are observed in future runs, such observations indicate that the spacing may be set too small. It also follows that, when significant increases of intensities in those bands are observed in future runs, such observations indicate that the spacing may be set too large. For the power, there is only one band (410–416) that is sensitive to distinguish two settings. The same band is also sensitive to the SiH$_4$ flow. For the N$_2$O flow there are eight bands that are sensitive. These sensitive spectral bands are also referred as reactive bands because they show reaction to changing the settings of the control parameters.

The above discussed observations on the spectral data changes caused by varying the settings on the control parameters may be used to determine diagnostic ratios (step 213). A diagnostic ratio is an equation derived based on, at least in part, the above described observations in order to adjust the control parameters. Table 3 shows that almost all of the spectral bands are sensitive to the $N_2O$ flow. Hence, the diagnostic ratio would be at least somewhat sensitive to the $N_2O$ flow.

Figure 14:
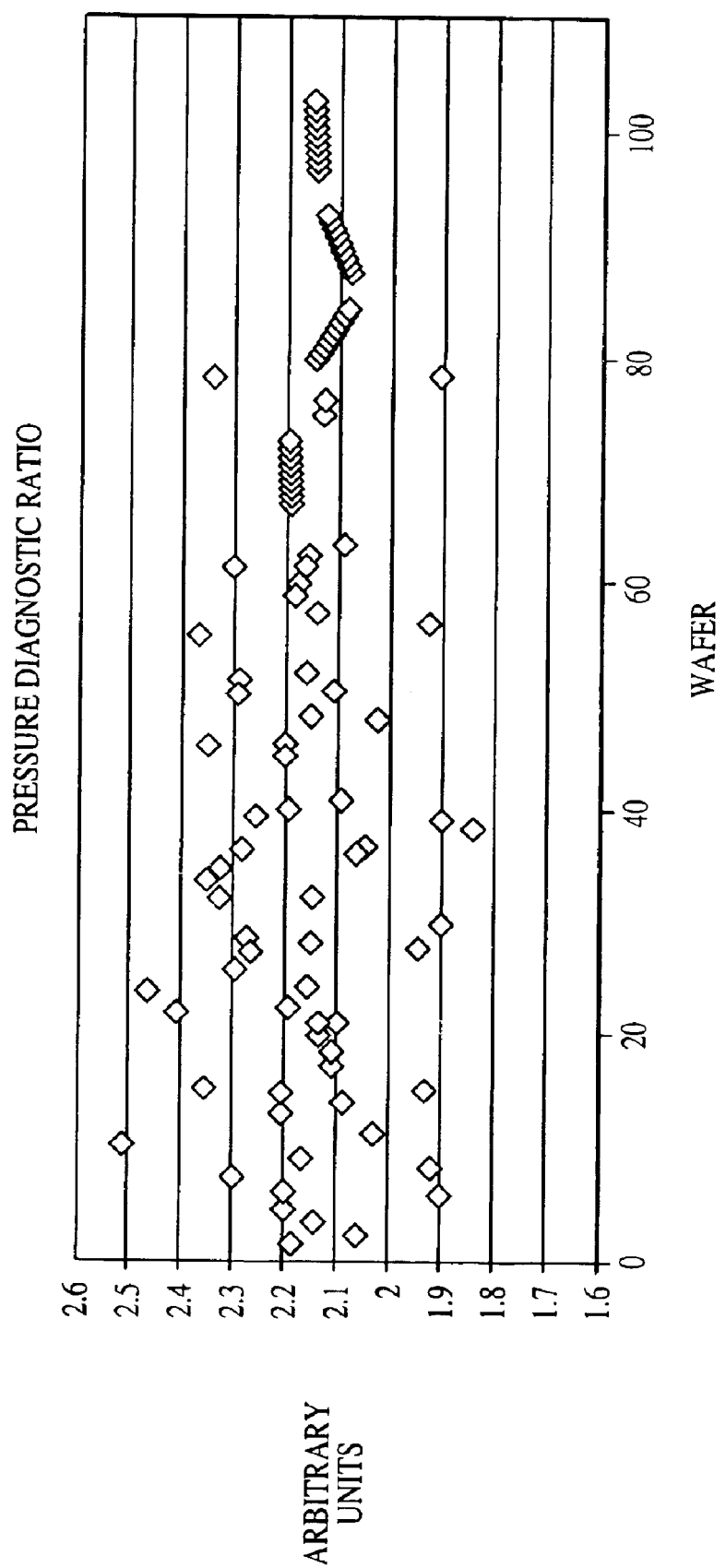
FIG. 14 is a diagram representing a plot of results obtained using a first diagnostic ratio.

FIG. 14 shows the results of taking an example diagnostic ratio calculated by summing the spectral data of the 392.6–395.1 nm, 395.5–401.5 nm, 401.5–408 nm, 430.2–437 nm, and 445.1–450.06 nm bands, dividing the sum by the spectral data of the 421.3–430.2 band, and then, subtracting therefrom the value obtained by dividing the spectral data of the 416–421 nm band by the 421.3–430.2 nm band. This diagnostic ratio is chosen because the intensities of the five bands in the numerator of the first term are decreased for the high pressure and increased for the low pressure, while the intensities of the last two bands are increased for the high pressure and decreased for the low pressure. Note that the bands show the opposite behaviors for the $N_2O$ flows. However, several of the bands do not show a change for the low $N_2O$ flow. Hence, the diagnostic ratio may not be as strong for the $N_2O$ flow as it is for the pressure.

For each run, the diagnostic ratio is calculated as described above and plotted as shown in FIG. 14. In particular, the plotted points located between 2.1 and 2.2 of the Y-axis (i.e., the value of the diagnostic ratio) represent the diagnostic ratios calculated for center point runs. The plotted points having the Y-axis value greater than 2.3 represent runs in which the pressure was set too high, and the plotted points having the Y-axis value smaller than 2.0 represent runs in which the pressure was set too low. In addition, the plotted points having the Y-axis value between 2.2 to 2.3 represent runs in which the N2O flow was set too low, and the plotted points having the Y-axis value between 2.0 and 2.1 represent N2O flow was set too high.

Figure 15:
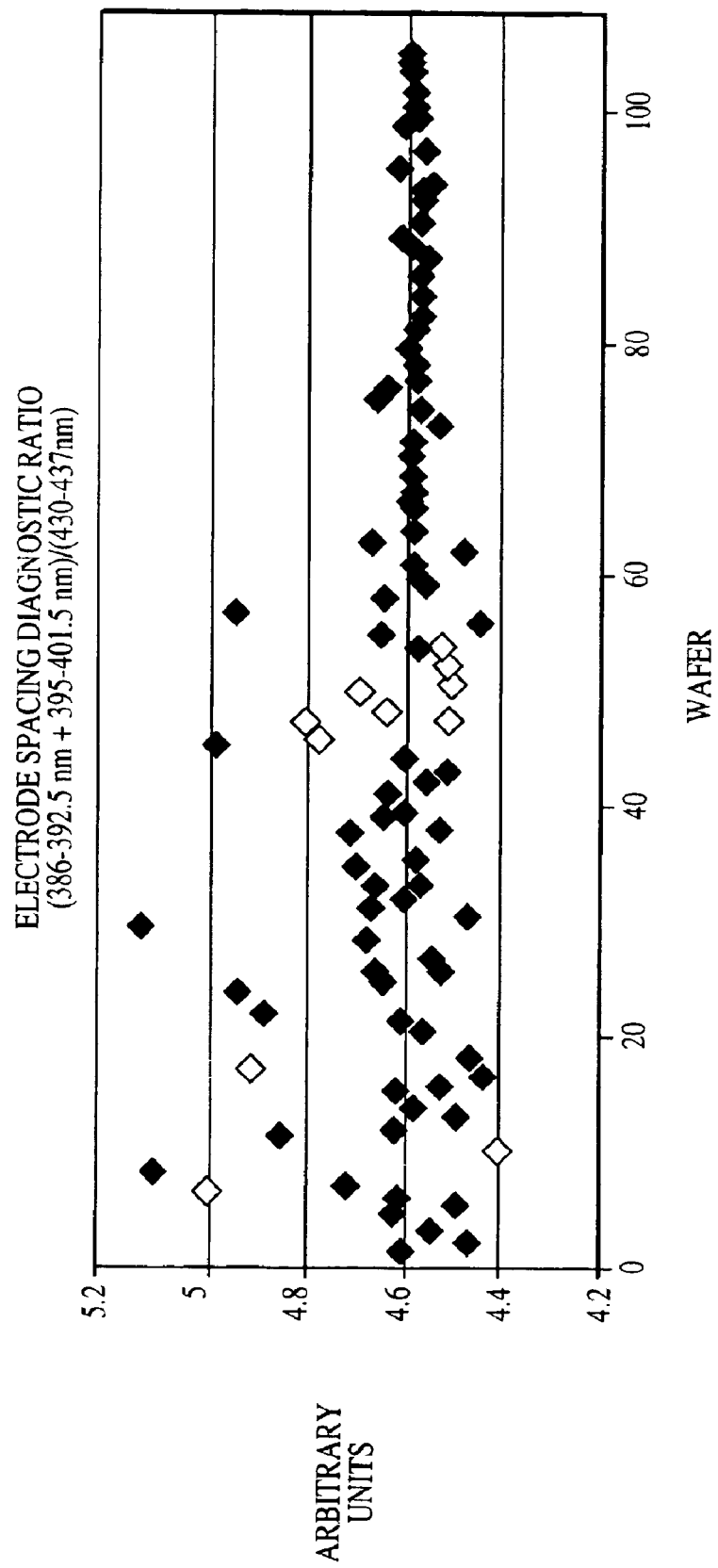
FIG. 15 is a diagram representing a plot of results obtained using a second diagnostic ratio.

In another example ratio, FIG. 15 shows results of a diagnostic ratio of the sum of the spectral data the 386–392.5 nm, the 395–401.5 nm, and to the 430–437 nm bands. The runs shown in white are the runs in which both parameters were modified. The above-described diagnostic ratio is more sensitive to the electrode spacing being too small than it is to the spacing being too large. Note also that the ratio becomes more sensitive the more the spacing is out of the center point recipe. For instance, the plotted points located between 4.8 and 5.2 represent runs in which the electrode spacing was set too narrowly. This ratio appears to be somewhat sensitive to the $N_2O$ flow, but not as sensitive as the previous ratio. Nevertheless, the spacing of the electrodes dominates when both parameters are modified simultaneously. Note also that this ratio is not sensitive to the deposition of the film on the window.

Now turning to describe a general mathematical formulation to determine diagnostic ratios, a conventional method is first described below along with its shortcomings, and then, a different method contemplated by at least some embodiments of the present invention relating to the general mathematical formation of diagnostic ratios is described.

In general, the conventional methods of determining diagnostic ratios proceed by first identifying the spectral bands that corresponding to major emission bands in the spectral data. Spectral data that originate from identified spectral bands are then used in a statistical analysis to correlate the spectral data with particular properties of run results using a simple linear model such as follows:

$$\text{Property} = a_1 I_1 + a_2 I_2 + \ldots + a_n I_n + \text{const.}$$

where $I_i$ represents absolute values of the spectral data of the identified spectral bands, $a_i$ represents the coefficients derived by the statistical mapping model, and n is the number of bands used in the model. In general, the more bands that are used in the equation the more accurately the models reproduce observed film properties.

A drawback of this conventional method is that using the absolute values of the spectral data of the spectral bands requires a precise calibration of the entire data collection system. Several events that are likely to occur in the production environment would require a recalibration of the data collection system. These events include, for example, drifting control parameters, a change in substrate parameters resulting in a change in substrate reflectivity, clouding of the chamber window due to deposition of a film, and/or degrading optical fibers.

To best handle the non-predictive nature of the conventional techniques, one would need to either closely monitor chamber, process, optics, and spectrometer conditions to determine when a recalibration is necessary, or insert a calibration step between each process run, costing additional time and resources. Consequently, a calibration free solution would be desirable.

Thus, at least some embodiments of the present invention contemplate employing simple linear relationships of spectral data as do the conventional system, but instead use ratios in its equation as illustrated in the diagnostic ratios discussed above in connection with FIGS. 14–15. In particular, the general mathematical formulation of embodiments the present invention is as follows:

$$\text{process parameters} = a_1 R_1 + a_2 R_2 + \ldots + a_n R_n + \text{const.} \qquad \text{Eq. 1}$$

where $R_i$ represents ratios of bands. The ratio can be formed by using reactive bands and non-reactive bands, which are determined by noting the bands that were the most and least sensitive to changes to the settings of the control parameters. It should be noted that Eq. 1 is a generalized mathematical formulation of the example diagnostic ratio discussed above in connection with FIGS. 14–15.

The form of the ratios may depend on the collected spectral data. Using a model based on spectral ratios rather than the absolute intensities of spectral bands overcomes the need for an absolute calibration of the data collection system since one is only concerned with the relative intensities of the spectral data and not their absolute values. In fact, the diagnostic ratios are widely applicable for characterizing more than just the film properties. One may also characterize the process status, the chamber status, the spectrometer status and the like.

In at least some embodiments of the present invention, modeling step 101 is completed when the diagnostic ratios are determined. Subsequently, one or more diagnostic ratios are used in monitoring and controlling steps (steps 103 and 105, respectively). Although these steps are shown in a sequence, aspects of these steps may be performed separate from (e.g., in parallel with) each other. These steps can be executed using a monitoring and controlling system.

Figure 16:
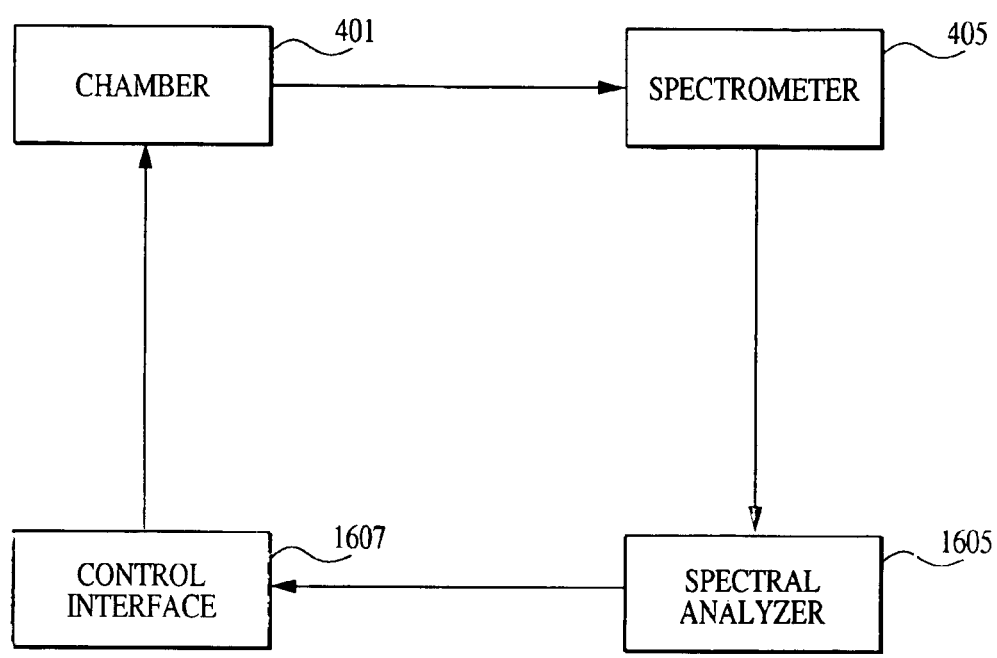
FIG. 16 is a schematic diagram representing a controlling system of at least some embodiments contemplated by the present invention.

FIG. 16 illustrates an example monitoring and controlling system that includes wafer tool 401 (with one more chambers), spectrometer 405, spectral analyzer 1605 and control interface 1601. Wafer tool 401 is coupled with spectrometer 405 as described above in connection with FIG. 4. Spectral analyzer 1605 is coupled with spectrometer 405 and control interface 1607. The example monitoring and controlling system includes a number of wafer tools 401 and support devices (e.g., optical cables) to be used in a manufacturing facility.

Spectral analyzer 1607 includes the features of spectral modeler 411 described above in connection with FIG. 4. Accordingly, the diagnostic ratios described above are stored in spectral analyzer 1605. In addition, spectral analyzer 1605 is further configured to communicate with control interface 1607 with its communication interface.

In operation, wafer tool 401 and, spectrometer 405 function substantially similar as described above. Referring to FIG. 1, in at least some embodiments of the present invention, the monitoring step (step 103) is performed by spectrometer 405 and spectral analyzer 1605. More specifically, during the monitoring step, spectral data of plasma activities in the chamber(s) of wafer tool 401 is collected and results of one or more selected diagnostic ratios are generated based on the collected spectral data.

During the controlling step (step 105), control signals based on the results of the selected diagnostic ratios are produced by spectral analyzer 1605. For instance, if the results of the selected diagnostic ratios indicate that an excessive amount of gas is supplied, then spectral analyzer 1605 sends a control signal to control interface 1607 to decrease the gas supply to the corresponding chamber(s) of the wafer tool 401. In turn, control interface 1607 physically carries out the instructions of the control signal. In this example, control interface 1607 would proportionally close a valve that supplies the gas to the corresponding chamber(s) of the wafer tool 401.

Figure 17:
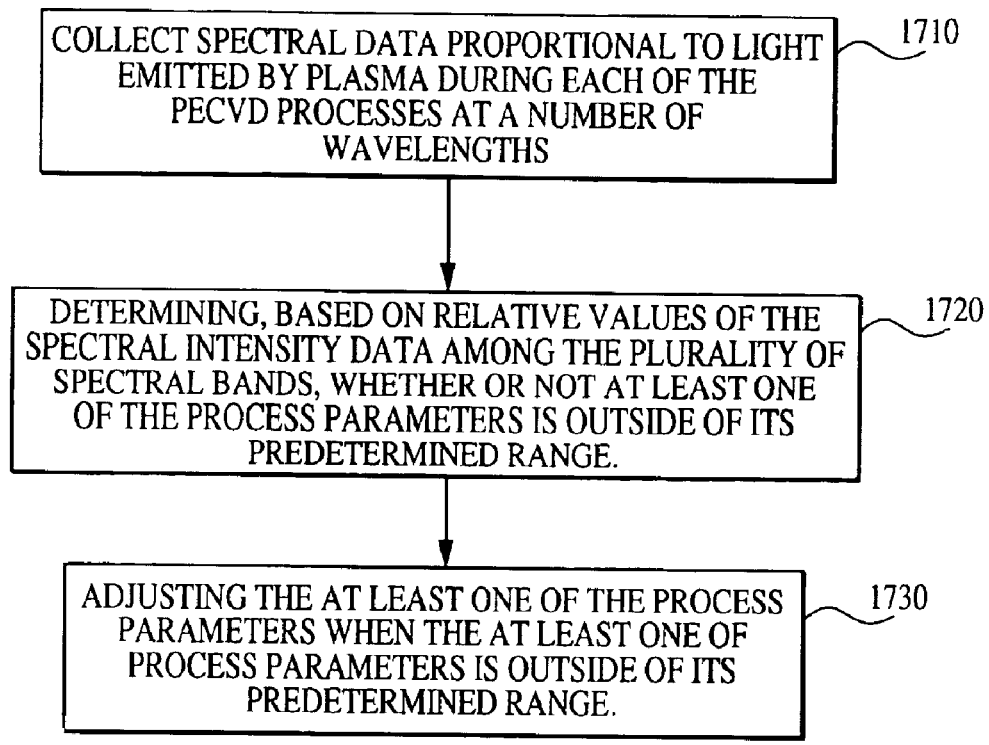
FIG. 17 is a flow chart representing the steps in controlling a PECVD process of the present invention.

The monitoring and controlling steps are shown in the flow chart in FIG. 17. In particular, spectral data proportional to light emitted by plasma during a PECVD run is collected (step 1710). The collected data is processed in real time to generate the results of the selected diagnostic ratios (step 1720). Based on the results of the diagnostic ratios, one or more the control parameters are modified to ensure that the PECVD run would be performed close to its center point recipe (step 1730).

Figure 18:
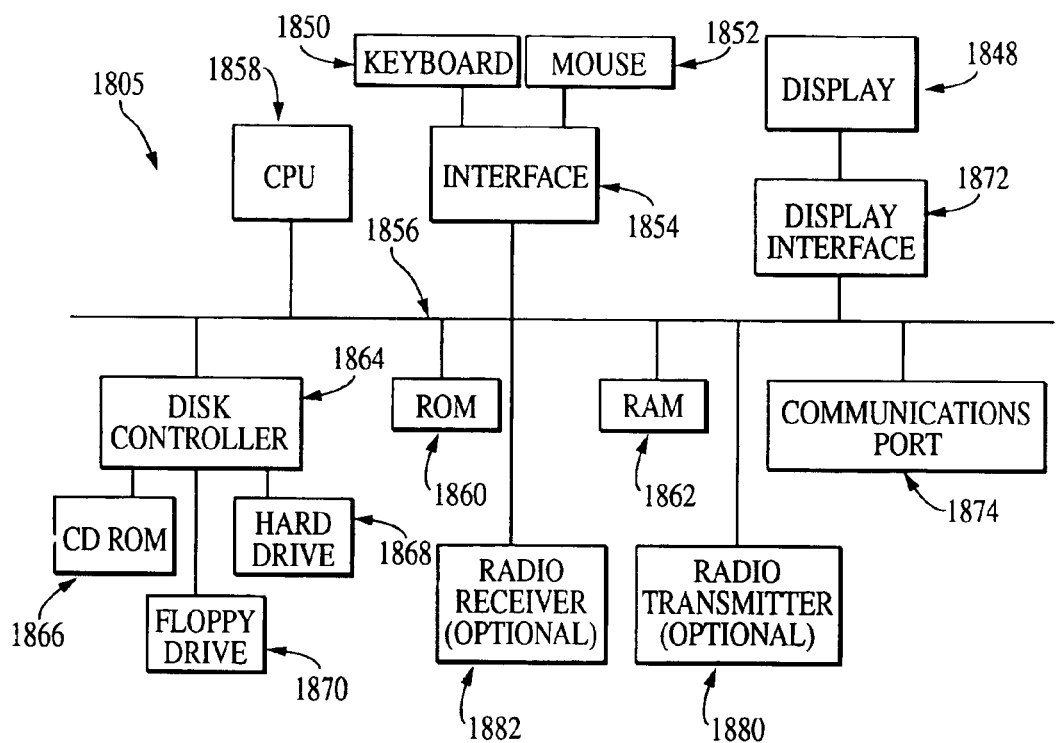
FIG. 18 is a block diagram representation of an example embodiment of a spectral modeler.

Now turning to describe the internal working of spectral analyzer 1605 (some features of which may also be applicable to spectral modeler 411), FIG. 18 illustrates a block diagram of one example of the internal hardware of spectral modeler 411. A bus 1856 serves as the main information highway interconnecting various components of analyzer 1605. CPU 1605 is the central processing unit of the analyzer, performing calculations and logic operations required to execute the processes of the present invention as well as other programs. Read only memory (ROM) 1860 and random access memory (RAM) 1862 constitute the main memory of modeler 1811. Disk controller 1864 interfaces one or more disk drives to the system bus 1856. These disk drives are, for example, floppy disk drives 1870, or CD ROM or DVD (digital video disks) drives 1866, or internal or external hard drives 1868. These various disk drives and disk controllers are optional devices.

A display interface 1872 interfaces display 1848 and permits information from the bus 1856 to be displayed on display 1848. Display 1848 may be used in displaying various graphs as shown in FIGS. 5–15. Communications with external devices such as the other components of the system described above, occur utilizing, for example, communication port 1874. Optical fibers and/or electrical cables and/or conductors and/or optical communication (e.g., infrared, and the like) and/or wireless communication (e.g., radio frequency (RF), and the like) can be used as the transport medium between the external devices and communication port 1874. Peripheral interface 1854 interfaces the keyboard 1850 and mouse 1852, permitting input data to be transmitted to bus 1856. In addition to these components, the analyzer also optionally includes an infrared transmitter and/or infrared receiver. Infrared transmitters are optionally utilized when the computer system is used in conjunction with one or more of the processing components/stations that transmits/receives data via infrared signal transmission. Instead of utilizing an infrared transmitter or infrared receiver, the computer system may also optionally use a low power radio transmitter 1880 and/or a low power radio receiver 1882. The low power radio transmitter transmits the signal for reception by components of the production process, and receives signals from the components via the low power radio receiver. The low power radio transmitter and/or receiver are standard devices in industry.

Although the analyzer in FIG. 18 is illustrated having a single processor, a single hard disk drive and a single local memory, the analyzer is optionally suitably equipped with any multitude or combination of processors or storage devices. For example, the analyzer may be replaced by, or combined with, any suitable processing system operative in accordance with the principles of embodiments of the present invention, including sophisticated calculators, and hand-held, laptop/notebook, mini, mainframe and super computers, as well as processing system network combinations of the same.

Figure 19:
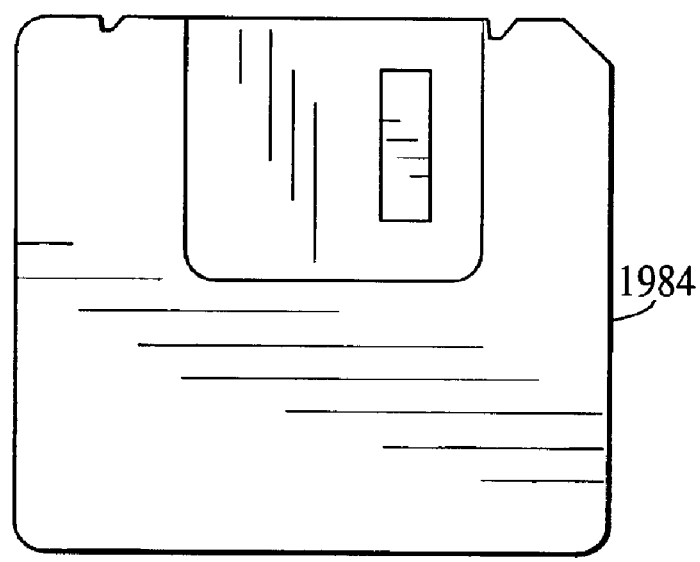
FIG. 19 illustrates one example of a memory medium which may be used for storing the spectral modeler of the present invention.

FIG. 19 is an illustration of an example computer readable memory medium 1984 utilizable for storing computer readable code or instructions. As one example, medium 1984 may be used with disk drives illustrated in FIG. 18. Typically, memory media such as floppy disks, or a CD ROM, or a digital video disk will contain, for example, a multi-byte locale for a single byte language and the program information for controlling the modeler to enable the computer to perform the functions described herein. Alternatively, ROM 1860 and/or RAM 1862 illustrated in FIG. 18 can also be used to store the program information that is used to instruct the central processing unit 1858 to perform the operations associated with various automated processes of the present invention. Other examples of suitable computer readable media for storing information include magnetic, electronic, or optical (including holographic) storage, some combination thereof, etc.

In general, it should be emphasized that the various components of embodiments of the present invention can be implemented in hardware, software or a combination thereof. In such embodiments, the various components and steps would be implemented in hardware and/or software to perform the functions of embodiments of the present invention. Any presently available or future developed computer software language and/or hardware components can be employed in such embodiments of the present invention. For example, at least some of the functionality mentioned above could be implemented using Visual Basic, C, C++, or any assembly language appropriate in view of the processor(s) being used. It could also be written in an interpretive environment such as Java and transported to multiple destinations to various users.

It should be noted that, although the above description relating to FIGS. 18 and 19 are related to only one set of wafer tool, spectrometer, spectral analyzer and control interface, it may be used in a manufacturing run, as noted above. Furthermore, the spectrometer and spectral analyzer and control interface may be provided for each chamber of wafer tools. In an alternative embodiment, one spectrometer may be provided for many wafer tools. Similarly, one spectral analyzer may be provided for many chambers of wafer tools and/or many spectrometers.

The many features and advantages of embodiments of the present invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A method of spectroscopically modeling a semiconductor manufacturing process, the method comprising the steps of:
   (1) conducting a plurality of semiconductor manufacturing process runs, wherein at least one of a plurality of process parameters is changed from its target value;
   (2) collecting spectral data indicative of light emitted by plasma during each of said plurality of semiconductor manufacturing process runs;
   (3) formulating a ratio based on a relationship between the collected spectral data and the change in the at least one of the plurality of process parameters;
   (4) conducting at least one center point process among said plurality of semiconductor manufacturing process runs by setting all of the plurality of process parameters thereof to their target values; and
   (5) conducting at least one one-parameter changing process among said plurality of semiconductor manufacturing process runs by setting one process parameter to change from its target value by a predetermined value, wherein said predetermined value is plus or minus 10% of a target value.

2. The method of claim 1, wherein the plurality of process parameters comprise parameters relating to at least one of gas pressure, Radio Frequency (RF) power, SiH$_4$ flow, a distance between electrodes, and N$_2$O flow used in the plasma based process runs.

3. The method of claim 1, wherein said step (3) further comprises the step of:
   collecting spectral data indicative of the light emitted by the plasma during each of the plurality of semiconductor process runs at each of a plurality of wavelengths.

4. The method of claim 3, wherein the step (3) further comprises the step of:
   forming a plurality of spectral bands by selecting and combining from the plurality of wavelengths based on responsiveness of the collected spectral data when the at least one of the plurality of process parameters is changed more than the predetermined value.

5. The method of claim 4 wherein the step (3) further comprises the step of:
   categorizing each formed spectral band based on deviation of its spectral data collected during the one-parameter changing process and during the center point process.

6. The method of claim 5 wherein the step (3) further comprises the steps of:
   combining the spectral data of the selected spectral bands based on correlation between the changes in the plurality of process parameters and the spectral data, wherein a value of the ratio is calculated from the combined spectral data.

7. The method of claim 6, wherein the value of the ratio in step (3) represents sensitivity of the semiconductor manufacturing process to the changes in said at least one of the plurality of process parameters.

8. A method of controlling a plasma based semiconductor manfacturing process, comprising the steps of:
   (1) collecting spectral data indicative of light emitted by plasma during a plurality of plasma based process runs;
   (2) arranging the collected spectral data into a plurality of predetermined spectral bands;
   (3) determining, based on a ratio of relative values of the spectral data among the plurality of predetermined spectral bands, whether or not at least one of a plurality of process parameters is outside of its predetermined range;
   (4) combining the spectral data of the selected spectral bands based on predictive value of the combination; and
   (5) adjusting the at least one of the plurality of process parameters when the at least one of the plurality of process parameters is outside of its predetermined range.

9. The method of claim 8, wherein the plurality of process parameters comprise parameters relating to at least one of gas pressure, electrode spacing, Radio Frequency (RF) power, SiH$_4$ flow and N$_2$O flow used in the plasma based process runs.

10. The method of claim 8, wherein the step (4) further comprises the step of:
    adjusting the at least one of the plurality of process parameters based on the combined spectral data of the selected spectral bands.

11. A method of controlling a plasma based semiconductor manufacturing process, comprising the steps of:
    (1) spectroscopically modeling plasma based processes, comprising the steps of:
       (a) conducting a plurality of plasma based process runs, wherein at least one of a plurality of process parameters is changed from its target value, and comprising the steps of:
          (i) conducting at least one center point process during which all of the plurality of process parameters are set to their respective target values;
          (ii) conducting at least one one-parameter changing process for which one of the plurality of process parameters is changed from its target value by predetermined value; and
          (iii) conducting at least one two-parameter changing process for which two of the plurality of process parameters are changed from their respective target values by the predetermined value; and
       (b) collecting spectral data indicative of light emitted by plasma during each of the plurality of plasma based process runs;
       (c) arranging the collected spectral data into a plurality of spectral bands; and
       (d) formulating a ratio based on a relationship between the collected spectral data arranged into the plurality of spectral bands and the change in the at least one of the plurality of process parameters;
    (2) determining, based on values of the ratio, whether or not the at least one of the plurality of process parameters is outside of its predetermined range during subsequent plasma based process run; and
    (3) adjusting the at least one of the plurality of process parameters when the at least one of the plurality of process parameters is outside of its predetermined range.

12. The method of claim 11, wherein the steps (1)(a) further comprises parameters directed to at least one of gas pressure, Radio Frequency (RF) power, $SiH_4$ flow and $N_2O$ flow used in the plasma based process runs.

13. The method of claim 11, wherein the predetermined value is plus or minus 10% of a target value.

14. The method of claim 11, wherein the step (1) further comprises the step of:

categorizing each spectral band based on deviation of its spectral data collected during the one-parameter change run and the center point run.

15. The method of claim 11, wherein the step (1) further comprises the step of:

combining the spectral data of the selected spectral bands based on predictive value of the combination.

16. A system of controlling a plasma processes based semiconductor manufacturing process, comprising:

a spectral sensor configured to observe light emitted from a plasma based process and generate spectral intensity data indicative of the observed light for a plurality of spectral bands;

a processor configured to determine, based on a ratio of values of the spectral intensity data among the plurality of spectral bands, whether or not at least one of a plurality of process parameters is outside of its predetermined range, wherein the plurality of process parameters comprise at least one of gas pressure, RF power, electrode spacing, $SiH_4$ flow rate and $N_2O$ flow rate; and a controller configured to adjust the at least one of the plurality of process parameters when the at least one of the plurality of process parameters is outside of its predetermined range, wherein the processor is further configured to generate the ratio of values between reactive and non-reactive spectral bands.

17. The system according to claim 16, wherein the processor is further configured to select at least one spectral band from the plurality of spectral bands in order to determine whether or not one of the plurality of processing parameters is outside of its range.

18. A method of controlling plasma based semiconductor manufacturing process, comprising the steps of:

(1) receiving spectral data indicative of light emitted by plasma during a plasma based process run;

(2) determining, based on a ratio of relative values of the spectral intensity data among the plurality of spectral bands, whether or not at least one of process parameters is outside of its predetermined range, wherein the process parameters include a gas pressure applied to the plasma based process; and (3) generating an output signal to adjust the at least one of the process parameters when the at least one of process parameters is outside of its predetermined range, wherein said predetermined value is plus or minus 10% of a target value.

19. A computer readable medium including instructions being executed by a computer, the instructions instructing the computer to control a plasma based semiconductor manufacturing process, the instructions comprising:

(1) receiving spectral data indicative of light emitted by plasma during a plasma based process run;

(2) determining, based on a ratio of relative values of the spectral data among a plurality of spectral bands, whether or not at least one of a plurality of process parameters is outside of its predetermined range, wherein the plurality of process parameters include at least one of gas pressure, Radio Frequency (RF) power, $SiH_4$ flow and $N_2O$ flow applied to the plasma based process run, further comprising the step of combining the spectral date of the selected spectral bands based on predictive value of the combination; and (3) generating an output signal to adjust the at least one of the plurality of process parameters when the at least one of the plurality of process parameters is outside of its predetermined range.

* * * * *